US010765020B2

(12) United States Patent
Prest et al.

(10) Patent No.: US 10,765,020 B2
(45) Date of Patent: *Sep. 1, 2020

(54) GLASS ENCLOSURE

(71) Applicant: Apple Inc., Cupertino, CA (US)

(72) Inventors: Christopher Prest, San Francisco, CA (US); Emery A. Sanford, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/538,686

(22) Filed: Aug. 12, 2019

(65) Prior Publication Data

US 2019/0364680 A1     Nov. 28, 2019

Related U.S. Application Data

(63) Continuation of application No. 16/022,588, filed on Jun. 28, 2018, now Pat. No. 10,398,043, which is a
(Continued)

(51) Int. Cl.
*H05K 5/02* (2006.01)
*G06F 1/16* (2006.01)
(Continued)

(52) U.S. Cl.
CPC ....... *H05K 5/0217* (2013.01); *G02F 1/13338* (2013.01); *G02F 1/13439* (2013.01); *G06F 1/1626* (2013.01); *G06F 1/1643* (2013.01); *G06F 1/1656* (2013.01); *H04B 1/3888* (2013.01); *H04M 1/0249* (2013.01);
(Continued)

(58) Field of Classification Search
CPC .. H05K 5/0217; H05K 5/0249; G06F 1/1626; G06F 5/1637; G06F 5/1643; G06F 5/1656
See application file for complete search history.

(56) References Cited

U.S. PATENT DOCUMENTS 2,643,020 A   6/1953  Dalton
3,415,637 A  12/1968  Glynn
(Continued)

FOREIGN PATENT DOCUMENTS

AT         283630     10/1970
CN        1277090     12/2000
(Continued)

OTHER PUBLICATIONS

Aben, "Laboratory of Photoelasticity," Institute of Cybernetics at TTU, www.ioc.ee/res/photo.html, Oct. 5, 2000.
(Continued)

*Primary Examiner* — Adrian S Wilson
(74) *Attorney, Agent, or Firm* — Brownstein Hyatt Farber Schreck, LLP

(57) ABSTRACT

A handheld computing device that includes an enclosure having structural walls formed from a glass material that can be radio-transparent. The enclosure can be formed from a hollow glass tube or two glass members bonded together. A laser frit bonding process may be used to hermetically seal the two glass members together to create a water resistant electronic device.

20 Claims, 22 Drawing Sheets

US 10,765,020 B2
Page 2

Related U.S. Application Data continuation of application No. 15/226,737, filed on Aug. 2, 2016, now Pat. No. 10,021,798, which is a continuation of application No. 14/447,507, filed on Jul. 30, 2014, now Pat. No. 9,439,305, which is a continuation of application No. 13/233,940, filed on Sep. 15, 2011, now Pat. No. 8,824,140.

(60) Provisional application No. 61/384,211, filed on Sep. 17, 2010.

(51) Int. Cl.
| | |
|---|---|
| *G02F 1/1333* | (2006.01) |
| *G02F 1/1343* | (2006.01) |
| *H05K 5/00* | (2006.01) |
| *H04B 1/3888* | (2015.01) |
| *H04M 1/02* | (2006.01) |

(52) U.S. Cl.
CPC ......... *H05K 5/0017* (2013.01); *H05K 5/0086* (2013.01); *H05K 5/0091* (2013.01); *H05K 5/02* (2013.01); *H04M 2201/38* (2013.01); *Y10T 29/49002* (2015.01)

(56) References Cited

U.S. PATENT DOCUMENTS

| | | | |
|---|---|---|---|
| 3,441,398 A | 4/1969 | Hess | |
| 3,467,508 A | 9/1969 | Loukes et al. | |
| 3,498,773 A | 3/1970 | Due et al. | |
| 3,558,415 A | 1/1971 | Rieser et al. | |
| 3,607,172 A | 9/1971 | Poole et al. | |
| 3,619,240 A | 11/1971 | Toussaint et al. | |
| 3,626,723 A | 12/1971 | Emile | |
| 3,652,244 A | 3/1972 | Plumat | |
| 3,753,840 A | 8/1973 | Plumat | |
| 3,798,013 A | 3/1974 | Hasegawa et al. | |
| 3,843,472 A | 10/1974 | Toussaint et al. | |
| 3,857,689 A | 12/1974 | Koizumi et al. | |
| 3,926,605 A | 12/1975 | Kunkle | |
| 3,951,707 A | 4/1976 | Kurtz et al. | |
| 4,015,045 A | 3/1977 | Rinehart | |
| 4,052,184 A | 10/1977 | Anderson | |
| 4,119,760 A | 10/1978 | Rinehart | |
| 4,156,755 A | 5/1979 | Rinehart | |
| 4,165,228 A | 8/1979 | Ebata et al. | |
| 4,178,082 A | 12/1979 | Ganswein et al. | |
| 4,212,919 A | 7/1980 | Hoda | |
| 4,218,230 A | 8/1980 | Hogan | |
| 4,346,601 A | 8/1982 | France | |
| 4,353,649 A | 10/1982 | Kishii | |
| 4,425,810 A | 1/1984 | Simon et al. | |
| 4,537,820 A | 8/1985 | Nowobilski et al. | |
| 4,646,722 A | 3/1987 | Silverstein et al. | |
| 4,733,973 A | 3/1988 | Machak et al. | |
| 4,842,629 A | 6/1989 | Clemens et al. | |
| 4,844,724 A | 7/1989 | Sakai et al. | |
| 4,846,868 A | 7/1989 | Aratani | |
| 4,849,002 A | 7/1989 | Rapp | |
| 4,872,896 A | 10/1989 | LaCourse et al. | |
| 4,911,743 A | 3/1990 | Bagby | |
| 4,937,129 A | 6/1990 | Yamazaki | |
| 4,957,364 A | 9/1990 | Chesler | |
| 4,959,548 A | 9/1990 | Kupperman et al. | |
| 4,983,197 A | 1/1991 | Froning et al. | |
| 4,986,130 A | 1/1991 | Engelhaupt et al. | |
| 5,041,173 A | 8/1991 | Shikata et al. | |
| 5,104,435 A | 4/1992 | Oikawa et al. | |
| 5,129,934 A | 7/1992 | Koss | |
| 5,157,746 A | 10/1992 | Tobita et al. | |
| 5,160,523 A | 11/1992 | Honkanen et al. | |
| 5,254,149 A | 10/1993 | Hashemi et al. | |
| 5,269,888 A | 12/1993 | Morasca | |
| 5,281,303 A | 1/1994 | Beguin et al. | |
| 5,369,267 A | 11/1994 | Johnson et al. | |
| 5,411,563 A | 5/1995 | Yeh | |
| 5,437,193 A | 8/1995 | Schleitweiler et al. | |
| 5,445,871 A | 8/1995 | Murase et al. | |
| 5,483,261 A | 1/1996 | Yasutake | |
| 5,488,204 A | 1/1996 | Mead et al. | |
| 5,525,138 A | 6/1996 | Hashemi et al. | |
| 5,625,154 A | 4/1997 | Matsuhiro et al. | |
| 5,654,057 A | 8/1997 | Kitayama | |
| 5,725,625 A | 3/1998 | Kitayama et al. | |
| 5,733,622 A | 3/1998 | Starcke et al. | |
| 5,766,493 A | 6/1998 | Shin | |
| 5,780,371 A | 7/1998 | Rifqi et al. | |
| 5,816,225 A | 10/1998 | Koch et al. | |
| 5,825,352 A | 10/1998 | Bisset et al. | |
| 5,826,601 A | 10/1998 | Muraoka et al. | |
| 5,835,079 A | 11/1998 | Shieh | |
| 5,880,411 A | 3/1999 | Gillespie et al. | |
| 5,930,047 A | 7/1999 | Gunz et al. | |
| 5,953,094 A | 9/1999 | Matsuoka et al. | |
| 5,985,014 A | 11/1999 | Ueda et al. | |
| 6,050,870 A | 4/2000 | Suginoya et al. | |
| 6,058,356 A * | 5/2000 | Swanson | G01K 15/00 361/679.56 |
| 6,114,039 A | 9/2000 | Rifqui | |
| 6,120,908 A | 9/2000 | Papanu et al. | |
| 6,166,915 A | 12/2000 | Lake et al. | |
| 6,188,391 B1 | 2/2001 | Seely et al. | |
| 6,245,313 B1 | 6/2001 | Suzuki et al. | |
| 6,287,674 B1 | 9/2001 | Verlinden et al. | |
| 6,307,590 B1 | 10/2001 | Yoshida | |
| 6,310,610 B1 | 10/2001 | Beaton et al. | |
| 6,323,846 B1 | 11/2001 | Westerman et al. | |
| 6,325,704 B1 | 12/2001 | Brown et al. | |
| 6,327,011 B2 | 12/2001 | Kim | |
| 6,350,664 B1 | 2/2002 | Haji et al. | |
| 6,393,180 B1 | 5/2002 | Farries et al. | |
| 6,429,840 B1 | 8/2002 | Sekiguchi | |
| 6,437,867 B2 | 8/2002 | Zeylikovich et al. | |
| 6,516,634 B1 | 2/2003 | Green et al. | |
| 6,521,862 B1 | 2/2003 | Brannon | |
| 6,621,542 B1 | 9/2003 | Aruga | |
| 6,690,387 B2 | 2/2004 | Zimmerman et al. | |
| 6,718,612 B2 | 4/2004 | Bajorek | |
| 6,769,274 B2 | 8/2004 | Cho et al. | |
| 6,772,610 B1 | 8/2004 | Albrand et al. | |
| 6,810,688 B1 | 11/2004 | Duisit et al. | |
| 6,936,741 B2 | 8/2005 | Munnig et al. | |
| 6,955,971 B2 | 10/2005 | Ghyselen et al. | |
| 6,996,324 B2 | 2/2006 | Hiraka et al. | |
| 7,012,700 B2 | 3/2006 | De Groot et al. | |
| 7,013,709 B2 | 3/2006 | Hajduk et al. | |
| 7,015,894 B2 | 3/2006 | Morohoshi | |
| 7,070,837 B2 | 7/2006 | Ross | |
| 7,123,243 B2 * | 10/2006 | Kawasaki | G02F 1/13338 345/173 |
| 7,166,531 B1 | 1/2007 | van Den Hoek et al. | |
| 7,184,064 B2 | 2/2007 | Zimmerman et al. | |
| 7,461,564 B2 | 12/2008 | Glaesemann | |
| 7,558,054 B1 | 7/2009 | Prest et al. | |
| 7,626,807 B2 | 12/2009 | Hsu | |
| 7,663,607 B2 | 2/2010 | Hotelling et al. | |
| 7,810,355 B2 | 10/2010 | Feinstein et al. | |
| 7,872,644 B2 | 1/2011 | Hong et al. | |
| 7,918,019 B2 | 4/2011 | Chang et al. | |
| 8,013,834 B2 | 9/2011 | Kim | |
| 8,110,268 B2 | 2/2012 | Hegemier et al. | |
| 8,111,248 B2 | 2/2012 | Lee et al. | |
| 8,312,743 B2 | 11/2012 | Pun et al. | |
| 8,393,175 B2 | 3/2013 | Kohli et al. | |
| 8,551,283 B2 | 10/2013 | Pakula et al. | |
| 8,673,163 B2 | 3/2014 | Zhong | |
| 8,684,613 B2 | 4/2014 | Weber et al. | |
| 8,824,140 B2 * | 9/2014 | Prest | G02F 1/13439 361/679.56 |
| 9,439,305 B2 * | 9/2016 | Prest | G02F 1/13439 |
| 10,021,798 B2 * | 7/2018 | Prest | H04B 1/3888 |
| 10,398,043 B2 * | 8/2019 | Prest | H05K 5/0017 |
| 2002/0035853 A1 | 3/2002 | Brown et al. | |

(56) References Cited

U.S. PATENT DOCUMENTS

| | | |
|---|---|---|
| 2002/0105793 A1 | 8/2002 | Oda |
| 2002/0155302 A1 | 10/2002 | Smith et al. |
| 2002/0157199 A1 | 10/2002 | Piltingsrud |
| 2003/0003950 A1 | 1/2003 | Kroll |
| 2003/0024274 A1 | 2/2003 | Cho et al. |
| 2003/0057183 A1 | 3/2003 | Cho et al. |
| 2003/0077453 A1 | 4/2003 | Oaku et al. |
| 2003/0234771 A1 | 12/2003 | Mulligan et al. |
| 2004/0051944 A1 | 3/2004 | Stark |
| 2004/0119701 A1 | 6/2004 | Mulligan et al. |
| 2004/0137828 A1 | 7/2004 | Takahashi et al. |
| 2004/0142118 A1 | 7/2004 | Takechi |
| 2004/0163414 A1 | 8/2004 | Eto et al. |
| 2005/0058423 A1 | 3/2005 | Brinkmann et al. |
| 2005/0105071 A1 | 5/2005 | Ishii |
| 2005/0130721 A1* | 6/2005 | Gartrell ............ H04M 1/0283 455/575.8 |
| 2005/0135724 A1* | 6/2005 | Helvajian ............ B64G 1/10 385/14 |
| 2005/0174525 A1 | 8/2005 | Tsuboi |
| 2005/0193772 A1 | 9/2005 | Davidson |
| 2005/0245165 A1 | 11/2005 | Harada et al. |
| 2005/0259438 A1 | 11/2005 | Mizutani |
| 2005/0285991 A1 | 12/2005 | Yamazaki |
| 2006/0026521 A1 | 2/2006 | Hotelling et al. |
| 2006/0055936 A1 | 3/2006 | Yun et al. |
| 2006/0063351 A1 | 3/2006 | Jain |
| 2006/0070694 A1 | 4/2006 | Rehfeld et al. |
| 2006/0097991 A1 | 5/2006 | Hotelling et al. |
| 2006/0176524 A1* | 8/2006 | Willrich ............ G06F 1/1616 358/474 |
| 2006/0197753 A1 | 9/2006 | Hotelling et al. |
| 2006/0227331 A1 | 10/2006 | Wollmer et al. |
| 2006/0238695 A1 | 10/2006 | Miyamoto |
| 2006/0250559 A1 | 11/2006 | Bocko et al. |
| 2006/0268528 A1* | 11/2006 | Zadesky ............ H04M 1/0202 361/728 |
| 2006/0273304 A1* | 12/2006 | Cok .................. H01L 51/0096 257/40 |
| 2006/0292822 A1 | 12/2006 | Xie |
| 2006/0294420 A1 | 12/2006 | Schneider |
| 2007/0003796 A1 | 1/2007 | Isono et al. |
| 2007/0013822 A1 | 1/2007 | Kawata et al. |
| 2007/0029519 A1 | 2/2007 | Kikuyama et al. |
| 2007/0030436 A1 | 2/2007 | Sasabayashi |
| 2007/0039353 A1 | 2/2007 | Kamiya |
| 2007/0046200 A1 | 3/2007 | Fu et al. |
| 2007/0063876 A1 | 3/2007 | Wong |
| 2007/0089827 A1 | 4/2007 | Funatsu |
| 2007/0122542 A1 | 5/2007 | Halsey et al. |
| 2007/0132737 A1 | 6/2007 | Mulligan et al. |
| 2007/0158220 A1* | 7/2007 | Cleereman ............ A45C 11/00 206/320 |
| 2007/0196578 A1 | 8/2007 | Karp et al. |
| 2007/0236618 A1 | 10/2007 | Maag et al. |
| 2008/0020919 A1 | 1/2008 | Murata |
| 2008/0024470 A1* | 1/2008 | Andre .................. G09F 9/30 345/204 |
| 2008/0026260 A1 | 1/2008 | Kawai |
| 2008/0074028 A1 | 3/2008 | Ozolins et al. |
| 2008/0094716 A1 | 4/2008 | Ushiro et al. |
| 2008/0135175 A1 | 6/2008 | Higuchi |
| 2008/0158181 A1 | 7/2008 | Hamblin et al. |
| 2008/0202167 A1 | 8/2008 | Cavallaro et al. |
| 2008/0230177 A1 | 9/2008 | Crouser et al. |
| 2008/0243321 A1 | 10/2008 | Walser et al. |
| 2008/0261057 A1 | 10/2008 | Slobodin |
| 2008/0264176 A1 | 10/2008 | Bertrand et al. |
| 2008/0286548 A1 | 11/2008 | Ellison et al. |
| 2009/0046240 A1 | 2/2009 | Bolton |
| 2009/0049773 A1* | 2/2009 | Zadesky ............ B32B 17/10018 52/204.62 |
| 2009/0067141 A1 | 3/2009 | Dabov et al. |
| 2009/0091551 A1 | 4/2009 | Hotelling et al. |
| 2009/0096937 A1 | 4/2009 | Bauer et al. |
| 2009/0111538 A1 | 4/2009 | Araki et al. |
| 2009/0153729 A1 | 6/2009 | Hiltunen et al. |
| 2009/0162703 A1 | 6/2009 | Kawai |
| 2009/0197048 A1 | 8/2009 | Amin et al. |
| 2009/0202808 A1 | 8/2009 | Glaesemann et al. |
| 2009/0220761 A1 | 9/2009 | Dejneka et al. |
| 2009/0257189 A1 | 10/2009 | Wang et al. |
| 2009/0296325 A1* | 12/2009 | Morimoto ............ H04M 1/185 361/679.01 |
| 2009/0324899 A1 | 12/2009 | Feinstein et al. |
| 2009/0324939 A1 | 12/2009 | Feinstein et al. |
| 2010/0009154 A1 | 1/2010 | Allan et al. |
| 2010/0014232 A1* | 1/2010 | Nishimura ........ B29C 45/14073 361/679.3 |
| 2010/0028607 A1 | 2/2010 | Lee et al. |
| 2010/0035038 A1 | 2/2010 | Barefoot et al. |
| 2010/0053632 A1 | 3/2010 | Alphonse et al. |
| 2010/0061040 A1* | 3/2010 | Dabov .................. G06F 1/1626 361/679.01 |
| 2010/0062284 A1 | 3/2010 | Watanabe et al. |
| 2010/0091442 A1* | 4/2010 | Theobald ............ G06F 1/1616 361/679.09 |
| 2010/0113108 A1 | 5/2010 | Murata et al. |
| 2010/0119846 A1 | 5/2010 | Sawada |
| 2010/0137031 A1 | 6/2010 | Griffin et al. |
| 2010/0154992 A1 | 6/2010 | Feinstein et al. |
| 2010/0167059 A1 | 7/2010 | Hasimoto et al. |
| 2010/0171920 A1 | 7/2010 | Nishiyama |
| 2010/0179044 A1 | 7/2010 | Sellier et al. |
| 2010/0206008 A1 | 8/2010 | Harvey et al. |
| 2010/0215862 A1 | 8/2010 | Gomez et al. |
| 2010/0216514 A1 | 8/2010 | Smoyer et al. |
| 2010/0224767 A1 | 9/2010 | Kawano et al. |
| 2010/0265188 A1 | 10/2010 | Chang et al. |
| 2010/0277439 A1* | 11/2010 | Charlier ............ G06F 1/1616 345/176 |
| 2010/0279067 A1 | 11/2010 | Sabia et al. |
| 2010/0285275 A1 | 11/2010 | Baca et al. |
| 2010/0296027 A1 | 11/2010 | Matsuhira et al. |
| 2010/0315570 A1 | 12/2010 | Mathew et al. |
| 2010/0321305 A1 | 12/2010 | Chang et al. |
| 2011/0003619 A1 | 1/2011 | Fujii |
| 2011/0012873 A1 | 1/2011 | Prest |
| 2011/0019123 A1* | 1/2011 | Prest .................. C03C 19/00 349/58 |
| 2011/0019354 A1 | 1/2011 | Prest et al. |
| 2011/0030209 A1 | 2/2011 | Chang et al. |
| 2011/0063550 A1 | 3/2011 | Gettemy et al. |
| 2011/0067447 A1 | 3/2011 | Prest et al. |
| 2011/0072856 A1 | 3/2011 | Davidson et al. |
| 2011/0102346 A1 | 5/2011 | Orsley et al. |
| 2011/0159321 A1 | 6/2011 | Eda et al. |
| 2011/0164372 A1* | 7/2011 | McClure ............ G06F 1/1613 361/679.26 |
| 2011/0182084 A1 | 7/2011 | Tomlinson |
| 2011/0186345 A1 | 8/2011 | Pakula et al. |
| 2011/0188846 A1 | 8/2011 | Sorg |
| 2011/0199687 A1 | 8/2011 | Sellier et al. |
| 2011/0248152 A1 | 10/2011 | Svajda et al. |
| 2011/0255000 A1 | 10/2011 | Weber et al. |
| 2011/0255218 A1* | 10/2011 | Pakula .................. G06F 1/1626 361/679.01 |
| 2011/0255250 A1 | 10/2011 | Dinh |
| 2011/0267833 A1 | 11/2011 | Verrat-Debailleul et al. |
| 2011/0279383 A1 | 11/2011 | Wilson et al. |
| 2011/0300908 A1 | 12/2011 | Grespan et al. |
| 2011/0305875 A1 | 12/2011 | Sanford et al. |
| 2012/0018323 A1 | 1/2012 | Johnson et al. |
| 2012/0027399 A1 | 2/2012 | Yeates |
| 2012/0099113 A1 | 4/2012 | de Boer et al. |
| 2012/0105400 A1 | 5/2012 | Mathew et al. |
| 2012/0118628 A1 | 5/2012 | Pakula et al. |
| 2012/0135195 A1 | 5/2012 | Glaesemann et al. |
| 2012/0136259 A1 | 5/2012 | Milner et al. |
| 2012/0151760 A1 | 6/2012 | Steijner |
| 2012/0188743 A1 | 7/2012 | Wilson et al. |
| 2012/0196071 A1 | 8/2012 | Cornejo et al. |

(56) References Cited

U.S. PATENT DOCUMENTS

| | | |
|---|---|---|
| 2012/0202040 A1 | 8/2012 | Barefoot et al. |
| 2012/0236477 A1 | 9/2012 | Weber et al. |
| 2012/0236526 A1 | 9/2012 | Weber et al. |
| 2012/0281381 A1 | 11/2012 | Sanford |
| 2012/0328843 A1 | 12/2012 | Cleary et al. |
| 2013/0071601 A1 | 3/2013 | Bibl et al. |
| 2013/0083506 A1 | 4/2013 | Wright |
| 2013/0182259 A1 | 7/2013 | Brezinski et al. |
| 2013/0213565 A1 | 8/2013 | Lee et al. |
| 2014/0176779 A1 | 6/2014 | Weber et al. |
| 2015/0016058 A1 | 1/2015 | Prest |

FOREIGN PATENT DOCUMENTS

| | | |
|---|---|---|
| CN | 1369449 | 9/2002 |
| CN | 1694589 | 11/2005 |
| CN | 101025502 | 8/2007 |
| CN | 101206314 | 6/2008 |
| CN | 101523275 | 2/2009 |
| CN | 101465892 | 6/2009 |
| CN | 102131357 | 7/2011 |
| CN | 101267509 | 8/2011 |
| CN | 1322339 | 11/2011 |
| CN | 202799425 | 3/2013 |
| DE | 1496586 | 6/1969 |
| DE | 1771268 | 12/1971 |
| DE | 3212612 | 10/1983 |
| DE | 10322350 | 12/2004 |
| EP | 1038663 | 9/2000 |
| EP | 1206422 | 11/2002 |
| EP | 1592073 | 11/2005 |
| EP | 1593658 | 11/2005 |
| EP | 2025556 | 2/2009 |
| EP | 2036867 | 3/2009 |
| EP | 2075237 | 7/2009 |
| EP | 2196870 | 6/2010 |
| EP | 2233447 | 9/2010 |
| EP | 2483216 | 8/2012 |
| EP | 2635540 | 9/2013 |
| FR | 2797627 | 2/2001 |
| FR | 2801302 | 5/2001 |
| GB | 1346747 | 2/1974 |
| JP | H42011599 | 6/1963 |
| JP | H48006925 | 3/1973 |
| JP | H55031944 | 3/1980 |
| JP | H55067529 | 5/1980 |
| JP | H55095645 | 7/1980 |
| JP | H55136979 | 10/1980 |
| JP | H55144450 | 11/1980 |
| JP | H59013638 | 1/1984 |
| JP | H59037451 | 2/1984 |
| JP | H61097147 | 5/1986 |
| JP | H60066696 | 10/1986 |
| JP | H63060129 | 3/1988 |
| JP | H63222234 | 9/1988 |
| JP | H05032431 | 2/1993 |
| JP | S52049422 | 9/1993 |
| JP | S62042260 | 9/1994 |
| JP | H07050144 | 2/1995 |
| JP | H09073072 | 3/1997 |
| JP | S52031757 | 3/1997 |
| JP | H09507206 | 7/1997 |
| JP | H09312245 | 12/1997 |
| JP | 2000086261 | 3/2000 |
| JP | 2000163031 | 6/2000 |
| JP | 2002003895 | 7/2000 |
| JP | 2001083887 | 3/2001 |
| JP | 2002160932 | 6/2002 |
| JP | 2002342033 | 11/2002 |
| JP | 2003502257 | 1/2003 |
| JP | 2003146705 | 5/2003 |
| JP | 2004094256 | 3/2004 |
| JP | 2004259402 | 9/2004 |
| JP | 2004339019 | 12/2004 |
| JP | 2005140901 | 6/2005 |
| JP | 2005156766 | 6/2005 |
| JP | 2005162549 | 6/2005 |
| JP | 2007099557 | 4/2007 |
| JP | 2008001590 | 1/2008 |
| JP | 2008007360 | 1/2008 |
| JP | 2008063166 | 3/2008 |
| JP | 2008066126 | 3/2008 |
| JP | 2008192194 | 8/2008 |
| JP | 2008195602 | 8/2008 |
| JP | 2008216938 | 9/2008 |
| JP | 2008306149 | 12/2008 |
| JP | 2009167086 | 7/2009 |
| JP | 2009230341 | 10/2009 |
| JP | 2009234856 | 10/2009 |
| JP | 2010060908 | 3/2010 |
| JP | 2010064943 | 3/2010 |
| JP | 2010116276 | 5/2010 |
| JP | 2010195600 | 9/2010 |
| JP | 2010237493 | 10/2010 |
| JP | 2011032124 | 2/2011 |
| JP | 2011032140 | 2/2011 |
| JP | 2011158799 | 8/2011 |
| JP | 2011231009 | 11/2011 |
| JP | 2011527661 | 11/2011 |
| JP | 2013537723 | 10/2013 |
| KR | 102006005920 | 1/2006 |
| KR | 102010019526 | 2/2010 |
| KR | 102011030919 | 3/2011 |
| TW | 201007521 | 2/2010 |
| TW | 201235744 | 9/2012 |
| WO | WO 00/47529 | 8/2000 |
| WO | WO 02/42838 | 5/2002 |
| WO | WO 2004/014109 | 2/2004 |
| WO | WO 2004/061806 | 7/2004 |
| WO | WO 2004/106253 | 12/2004 |
| WO | WO 2007/089054 | 8/2007 |
| WO | WO 2008/044694 | 4/2008 |
| WO | WO 2008/143999 | 11/2008 |
| WO | WO 2009/003029 | 12/2008 |
| WO | WO 2009/078406 | 6/2009 |
| WO | WO 2009/099615 | 8/2009 |
| WO | WO 2009/102326 | 8/2009 |
| WO | WO 2009/125133 | 10/2009 |
| WO | WO 2010/005578 | 1/2010 |
| WO | WO 2010/014163 | 2/2010 |
| WO | WO 2010/019829 | 2/2010 |
| WO | WO 2010/080988 | 7/2010 |
| WO | WO 2010/101961 | 9/2010 |
| WO | WO 2011/008433 | 1/2011 |
| WO | WO 2011/041484 | 4/2011 |
| WO | WO 2012/015960 | 2/2012 |
| WO | WO 2012/106280 | 8/2012 |
| WO | WO 2013/106242 | 7/2013 |

OTHER PUBLICATIONS

Author Unknown, Chemically Strengthened Glass, Wikipedia, http://en/wikipedia.org/w/index.php?title=Chemically.sub.--strengthened.s-ub.--glass&oldid=284794988, Apr. 19, 2009.

Author Unknown, "Toward Making Smart Phone Touch-Screens More Glare and Smudge Resistant", e! Science News, http://eciencenews.com/articles/2009/08/19toward.making.smart.phone.touch-.screens.more.glare.and.smudge.resistant, 1 page, at least as early as Oct. 31, 2011.

Author Unknown, Wikipedia: "Iphone 4", www.wikipedia.org, 15 pages, at least as early as Oct. 31, 2011.

Author Unknown, Wikipedia: "Iphone 4", www.wikipedia.org, 17 pages, at least as early as Jan. 4, 2012.

Forooghian et al., "Investigative Ophthalmology & Visual Science," vol. 49, No. 10, Oct. 2008.

Karlsson et al., "The Technology of Chemical Glass Strengthening—a review," Glass Technology, European Journal of Glass Science and Technology A., vol. 51, No. 2, pp. 41-54, Apr. 2010.

Lee et al., "A Multi-Touch Three Dimensional Touch-Sensitive Tablet," Proceedings of CHI: ACM Conference on Human Factors in Computing Systems, pp. 21-25, Apr. 1985.

(56) References Cited

OTHER PUBLICATIONS

Mehrl et al., "Designer's Noticebook: Proximity Detection IR LED and Optical Crosstalk," http://ams.com/eng/content/view/download/145137, 5 pages, Aug. 1, 2011.
Ohkuma, "Development of a Manufacturing Process of a Thin, Lightweight LCD Cell," Department of Cell Process Development, IBM, Japan, Section 13.4., at least as early as Oct. 31, 2011.
Rubin, "The Automatic Recognition of Gestures," CMU-CS-91-202, Submitted in Partial Fulfillment of the Requirements of the Degree of Doctor of Philosophy in Computer Science at Carnegie Mellon University, 285 pages, Dec. 1991.
Rubin, "Combining Gestures and Direct Manipulation," CHI'92, pp. 659-660, May 1992.
Saxer et al., "High-Speed Fiber-Based Polarization—sensitive optical coherence tomography of in vivo human skin," Optics Letters, vol. 25, No. 18, pp. 1355-1357, Sep. 15, 2000.
Varshneya, "Chemical Strengthening of Glass: Lessons Learned and Yet to be Learned," International Journal of Applied Glass Science, vol. 1, No. 2, pp. 131-142, 2010.
Westerman, "Hand Tracking, Finger Identification and Chronic Manipulation of a Multi-Touch Surface," A Dissertation Submitted to the Faculty of the University of Delaware in Partial Fulfillment of the Requirements for the degree of Doctor of Philosophy in Electrical Engineering, 364 pages, Spring 1999.
Kingery et al., "Introduction to Ceramics," $2^{nd}$ Edition, John Wiley & Sons, pp. 792 and 833-844, 1976.

\* cited by examiner

GLASS ENCLOSURE

CROSS-REFERENCE TO RELATED APPLICATION(S)

This application is a continuation patent application of U.S. patent application Ser. No. 16/022,588, filed Jun. 28, 2018 and titled "Glass Enclosure," which is a continuation patent application of U.S. patent application Ser. No. 15/226,737, filed Aug. 2, 2016 and titled "Glass Enclosure," now U.S. Pat. No. 10,021,798, which is a continuation patent application of U.S. patent application Ser. No. 14/447,507, filed Jul. 30, 2014 and titled "Glass Enclosure," now U.S. Pat. No. 9,439,305, which is a continuation patent application of U.S. patent application Ser. No. 13/233,940, filed Sep. 15, 2011 and titled "Glass Enclosure," now U.S. Pat. No. 8,824,140, which is a nonprovisional patent application of and claims the benefit of U.S. Provisional Patent Application No. 61/384,211, filed Sep. 17, 2010 and titled "Glass Enclosure," the disclosures of which are hereby incorporated herein by reference in their entireties.

FIELD

The described embodiments relate generally to portable computing devices. More particularly, the present embodiments relate to enclosures of portable computing devices and methods of assembling portable computing devices.

BACKGROUND

In recent years, portable electronic devices, such as laptop computers, tablet computers, PDAs, media players, and cellular phones, have become compact and lightweight yet powerful. As manufacturers have been able to fabricate various operational components of these devices in smaller sizes, the devices themselves have become smaller. In most cases, despite having a more compact size, such components have increased power as well as operating speed. Thus, smaller devices may have much more functionality and power than larger devices of the past.

One design challenge associated with the portable electronic devices is in techniques for mounting structures within the portable computing devices. Conventionally, the structures have been laid over one of the casings (upper or lower) and attached to one of the casings with fasteners, such as screws, bolts, and rivets. That is, the structures are positioned in a sandwich like manner in layers over the casing and thereafter fastened to the casing. Such an assembly process can be both time consuming and cumbersome.

Another design challenge is to provide an aesthetically pleasing enclosure that is functional for the intended purpose of the device. With more devices being capable of wireless communications, a radio transparent enclosure would be beneficial, as it would allow components, such as antennas, to be positioned inside the enclosure. Users also desire an enclosure that can withstand mishaps. Thus, a water-resistant and scratch-resistant enclosure would also be desirable.

Therefore, it would be beneficial to provide improved enclosures for portable computing devices, particularly enclosures that are functional and aesthetically pleasing yet durable. In addition, there is a need for improvements in the manner in which structures are mounted within the enclosures. For example, improvements that enable structures to be quickly and easily installed within the enclosure, and that help position and support the structures in the enclosure.

SUMMARY

This paper describes various embodiments that relate to systems, methods, and apparatus for providing an enclosure suitable for a portable computing device. In particular, at least portions of the enclosure can be transparent or at least translucent and as such can be formed of materials such as glass. It will be understood that the enclosure can be formed of glass but does not need to have any transparent portion. In other words, the entire glass enclosure can be opaque. In other embodiments, the glass enclosure can be fully transparent or partially transparent or translucent.

According to one embodiment, a portable computing device capable of wireless communications is described. The portable computing device includes an integral and substantially seamless enclosure that surrounds and protects the internal operational components of the portable computing device. The enclosure includes a tube like main body that is extruded in its entirety with glass material that permits wireless communications therethrough.

According to another embodiment, a portable electronic device is provided. The portable electronic device includes a substantially seamless enclosure that surrounds and protects the internal operational components of the portable electronic device. The enclosure also includes at least one structural wall formed from a glass material.

According to yet another embodiment, a method for manufacturing a portable electronic device capable of wireless communications is disclosed. The portable electronic device surrounds and protects internal operation components. The method can be carried out by the following operations: providing an integral and substantially seamless enclosure extending along a longitudinal axis, sliding at least one operational component into an internal lumen defined by the enclosure, and securing the operational component to the lumen when the operational component is in its desired position within the lumen. The enclosure includes a structural wall defining a shape or form of the portable electronic device and is formed from a glass material that permits wireless communications therethrough.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as may be included within the spirit and scope of the described embodiments as defined by the appended claims. It should be noted that issued U.S. Pat. No. 7,515,431 "Handheld Computing Device" filed Jul. 2, 2004 by Zadesky et. al., and issued U.S. Pat. No. 7,724,532 "Handheld Computing Device" filed Aug. 7, 2006 by Zadesky et. al., (CIP of '431 patent) are both hereby incorporated by reference in their entireties for all purposes.

Figure 1:
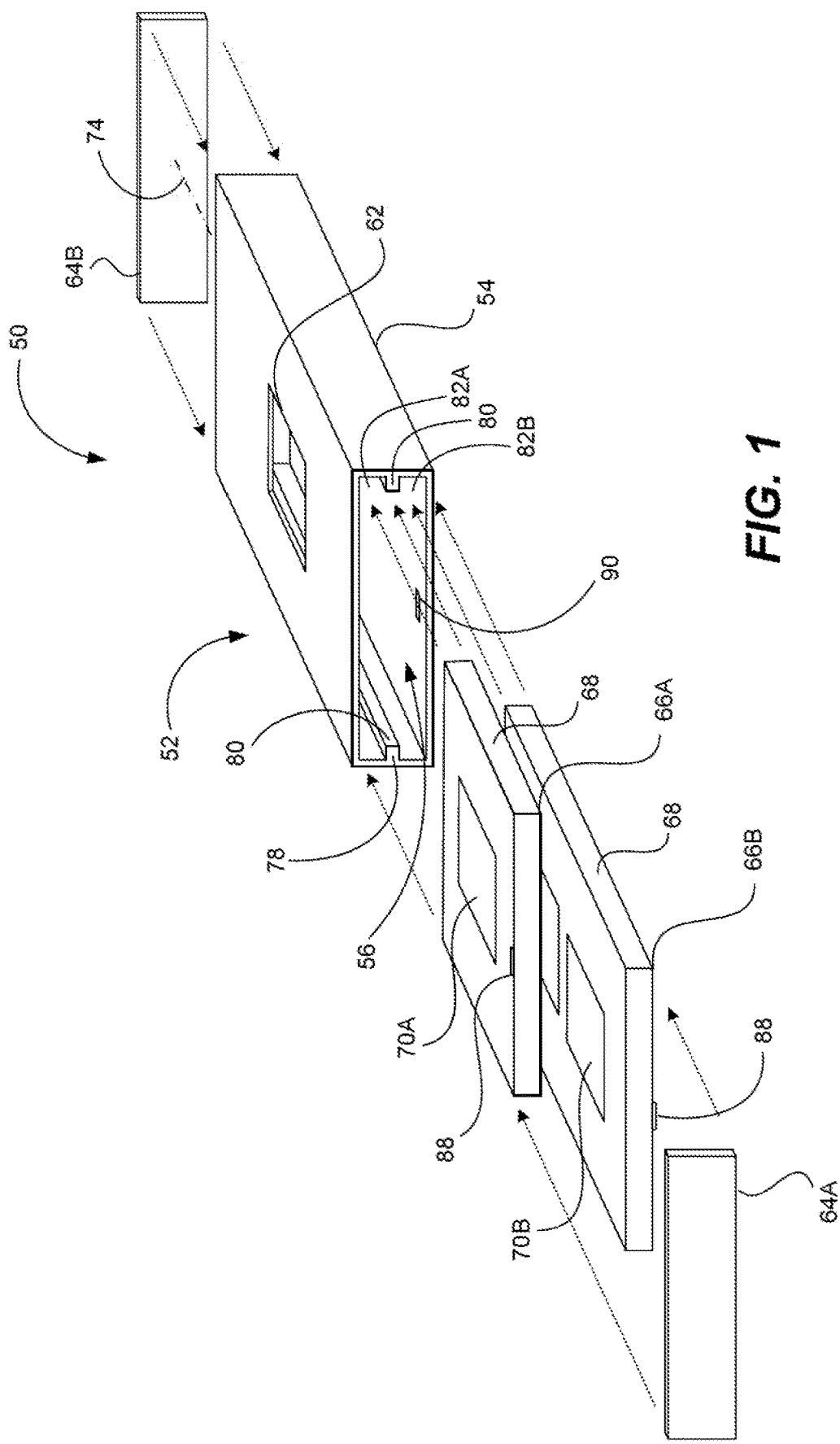
FIG. 1 is an exploded perspective diagram of an electronic device, in accordance with one embodiment.

FIG. 1 is an exploded perspective diagram of an electronic device 50, in accordance with one embodiment. The device 50 may be sized for one-handed operation and placement into small areas, such as a pocket. In other words, the device 50 can be a handheld pocket-sized electronic device. By way of example, the electronic device 50 may correspond to a computer, media device, telecommunication device, and the like.

The device 50 includes a housing 52 that encloses and supports internally various electrical components (including, for example, integrated circuit chips and other circuitry) to provide computing operations for the device 50. The housing 52 can also define the shape or form of the device 50. That is, the contour of the housing 52 may embody the outward physical appearance of the device 50. It should be noted that, although the device 50 is illustrated in FIG. 1 with 90 degree edges, it will be understood that the device 50 can have rounded or chamfered edges.

The housing 52 generally includes a main body 54 in the form of an integral tube. By integral, it is meant that the main body is a single complete unit. By being integrally formed, the main body is structurally stiffer than conventional housings, which typically include two parts that are fastened together. Furthermore, unlike conventional housings that have a seam between the two parts, the main body has a substantially seamless appearance. Moreover, the seamless housing prevents contamination and is more water resistant than conventional housings.

Because of the tube like configuration, the main body 54 can define a cavity 56 therethrough between two open ends. In some embodiments, the main body 54 has only one open end. The main body 54 can also include one or more windows 62, which provide access to the electrical components, particularly the user interface elements, when they are assembled inside the cavity 56 of the main body 54.

The main body 54 may be formed from a variety of materials or material combinations including, but not limited to, glass, metals, metal alloys, plastics, ceramics and the like. In a particular embodiment, the main body is formed of glass.

The material selected generally depends on many factors including, but not limited to, strength (tensile), density (lightweight), strength to weight ratio, Young's modulus, corrosion resistance, formability, finishing, recyclability, tooling costs, design flexibility, manufacturing costs, manufacturing throughput, reproducibility, and the like. The material selected may also depend on electrical conductivity, thermal conductivity, radio wave transparency, combustibility, toxicity, and the like. The material selected may also depend on aesthetics, including color, surface finish, and weight.

In one particular embodiment, the main body or glass enclosure 54, with or without internal rails 80, is formed from a glass tube. The glass tube may be formed from an extrusion or extrusion-like process. Some of the reasons for using glass over other materials are that glass is strong, stiff, and radio transparent and therefore a suitable material for an enclosure of an electronic device capable of wireless communications. The radio transparency is especially important for wireless hand held devices that include antennas internal to the enclosure. Radio transparency allows the wireless signals to pass through the enclosure and, in some cases, even enhances these transmissions. It will be understood that, although a glass enclosure is capable of wireless communications, the embodiments described herein need not be capable of wireless communication.

Figure 23:
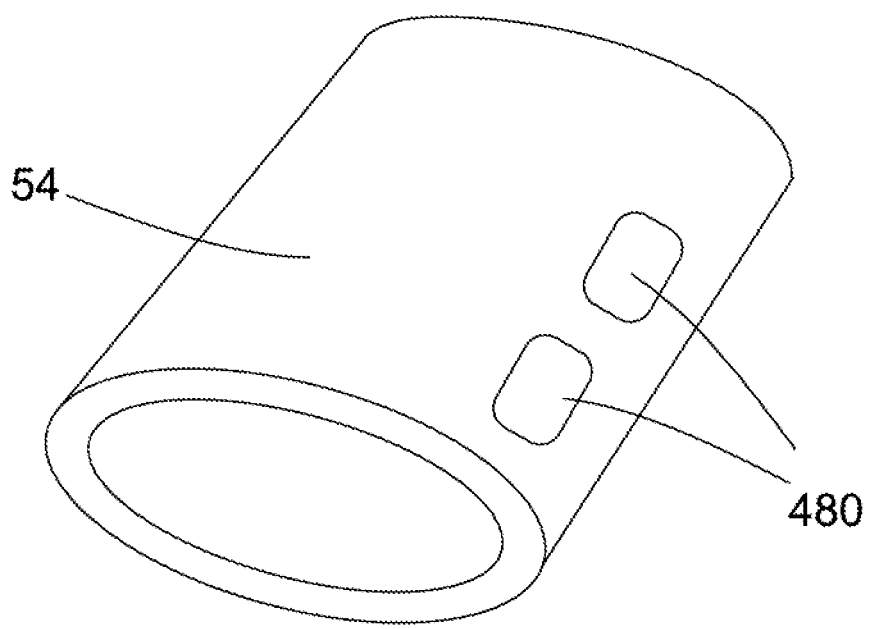
FIG. 23 is a perspective view of an embodiment of a glass main body having textured portions for use as light indicators.

A glass enclosure can also provide the portable electronic device with a unique, aesthetically pleasing appearance. To further provide an aesthetically pleasing appearance, the glass can also be coated with an oleophobic coating to reduce finger prints and smudging on the glass. The glass can also be coated with an anti-reflective coating to reduce glare. It will be understood that chemically strengthened glass can also be scratch resistant. The glass can also be color tinted in a wide variety of colors and can also have a variety of surface finishes including smooth and rough. For example, the glass can be polished to create a smooth (gloss) finish, or a blasting operation can performed to create a rough or textured (matte) finish. Portions 480 of the glass can also be textured so that the textured surface will disperse light and can be used as light indicator, as shown in FIG. 23.

As discussed in more detail below, the glass material can be formed so that the enclosure can have a seamless or substantially seamless appearance. The seamless enclosure, in addition to being aesthetically pleasing, can provide the added benefit of less contamination and moisture intrusion into the interior of the device.

It should be noted that glass has been used in a wide variety of products, including electronic devices, such as watches, and phones. In these cases, however, the glass materials have not been used as structural components. In most of these cases, the glass materials have been used as cosmetic accoutrements or solely as a screen for a display. It is believed that, up until now, glass materials have never been used as a structural element providing substantially all of the structural frames, walls and main body of a consumer electronic device, and more particularly an enclosure of a portable electronic device, such as a media player or mobile phone.

Figure 2:
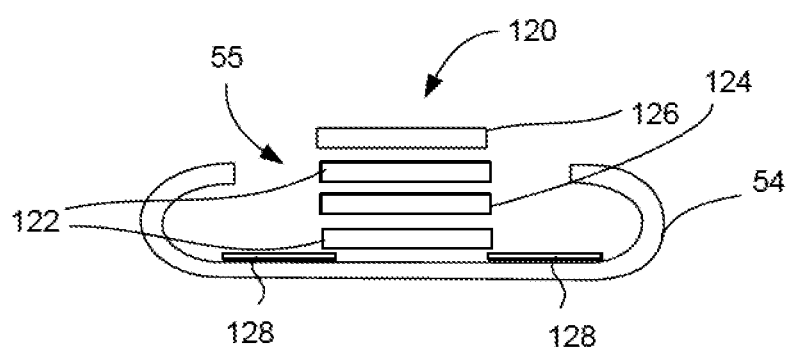
FIG. 2 is an exploded side view of a touch screen display assembly in a glass enclosure.

The glass enclosure also allows a display screen to be positioned underneath and protected by the glass enclosure. The glass material of the enclosure is capable of capacitive sensing so that a touch screen can be used through the glass enclosure. An embodiment of a touch screen display in a glass enclosure 54 is illustrated in FIG. 2, which is an exploded side view of the glass enclosure 54 with a liquid crystal display (LCD) touch screen assembly 120. According to this embodiment, the glass enclosure 54 can have an opening 55 on its rear face opposite the face with the display. In this embodiment, the entire touch screen display assembly 120 can be inserted through the opening 55 and into the enclosure. As shown in FIG. 2, the touch screen display assembly 120 includes a double indium tin oxide (DITO) 124 layer sandwiched between two optically clear adhesive (OCA) layers 122, and a LCD 126 over one of the OCA layers 122. The top OCA layer 122 can adhere the DITO layer 124 to the LCD 126. The bottom OCA layer 122 can adhere the touch screen display assembly 120 to the glass enclosure 54. By adhering the touch screen display assembly 120 directly to the glass enclosure 54, the cover glass of a conventional touch screen display assembly can be eliminated and the device can therefore be thinner as well as more aesthetically pleasing with a seamless enclosure. In this embodiment, the housing can be sealed with a door or a cap formed of glass or any other suitable material, including metal, plastic, and ceramic.

The glass enclosure around the display can be made opaque so the operational components of the device are not visible. One method of making the glass opaque is to use ink printing 128 in the areas where opacity is desired, as shown in FIG. 2. A mask can be used to mask off the display area. Alternatively, the opacity can be painted or screen printed. Other techniques for achieving opacity in certain areas, such as using a two-layer clad glass, can be used, as will be described in more detail below.

Figure 3:
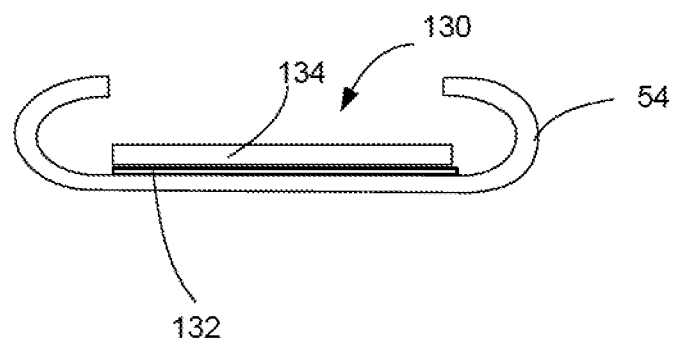
FIG. 3 is a side view of a LCD display integrated with a glass enclosure.

According to another embodiment shown in FIG. 3, a LCD 130 can be integrated with the glass enclosure 54. In this embodiment, a color filter panel 132 may be positioned between a thin film transistor (TFT) glass 134 and the glass enclosure 54 to form the LCD 130. A conventional LCD has a color filter panel sandwiched between two TFT glass layers. In this embodiment, the glass enclosure 54 is used in place of one of the TFT glass layers. This embodiment therefore allows the device to be thinner, as one less piece of TFT glass is used. It will be understood, that although the embodiment illustrated in FIG. 3 shows an opening in the enclosure 54, this embodiment of the LCD can be employed in any of the embodiments of glass enclosures described herein.

In order to seal the main body 54, the housing 52 can additionally include a pair of end caps or plugs 64A and 64B. Each of the end caps or plugs 64 is configured to cover one of the open ends of the main body 54, thereby forming a fully enclosed housing system. In some embodiments, the end caps 64 can be formed of materials, such as plastic, metal, and ceramic. The end caps 64 also serve as protection for the edges of the glass main body 54, as will be explained in more detail below.

Figure 19:
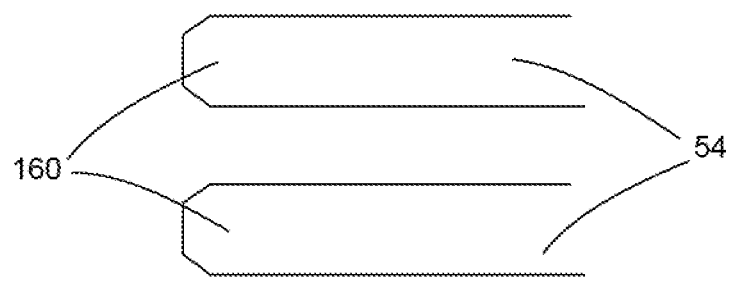
FIGS. 19 and 20 are side view showing chamfered edges and radius edges of an embodiment of a glass enclosure.
Figure 20:
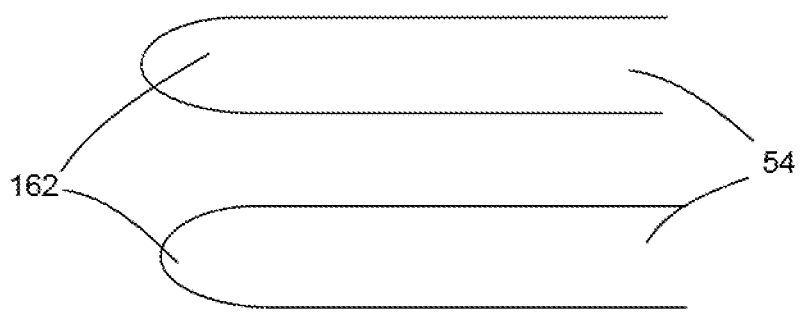

As noted above, it is desirable for an enclosure to be durable. A piece of glass typically breaks due to an exposed edge. For glass materials, crisp, 90 degree edges and corners are prone to failure. Crisp edges can easily be chipped off and become an origin for crack propagation. Thus, it is important to treat the edges of the glass. The edges can be machined or buffed to make an edge chamfer 160 (as shown in FIG. 19) or an edge radius 162 to round out the edges (as shown in FIG. 20). In addition, the edges can be coated with a protective material. In some embodiments, the exposed ends of the glass enclosure can be covered by applying protective coatings, such as plated metal using metallization or PVD plate metal. Alternatively, polymer coatings can be applied over the exposed glass edges. The end caps 64 can also provide further protection for the glass edges.

Furthermore, the end caps 64 may be attached to the main body 54 using a variety of techniques, including but not limited to, fasteners, glues, snaps, and the like. In some cases, the end caps 64 may be positioned on the surface of the open ends. If so, they typically have the same shape as the outer periphery of the main body 54. In order to eliminate gaps, cracks or breaks on the front and side surfaces, the end caps 64 may alternatively be placed inside the cavity 56 at each of the ends. In this arrangement, the outer periphery of the end cap 64 generally matches the inner periphery of the main body 54. This implementation is typically preferred in order to form a housing 52 with a uniform and seamless appearance, i.e., no breaks when looking directly at the front, back or side of the housing.

Figure 4:
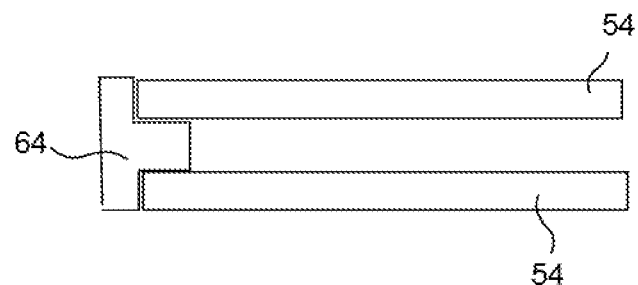
FIG. 4 shows an embodiment of end caps for a glass enclosure.
Figure 5A:
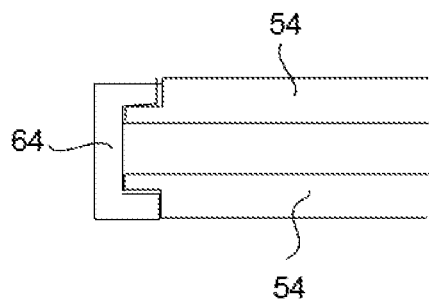
FIGS. 5A and 5B show embodiments of end caps for a glass enclosure.
Figure 5B:
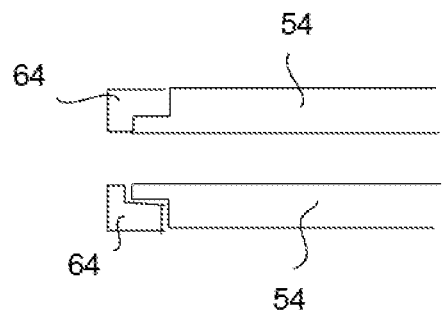
Figure 6A:
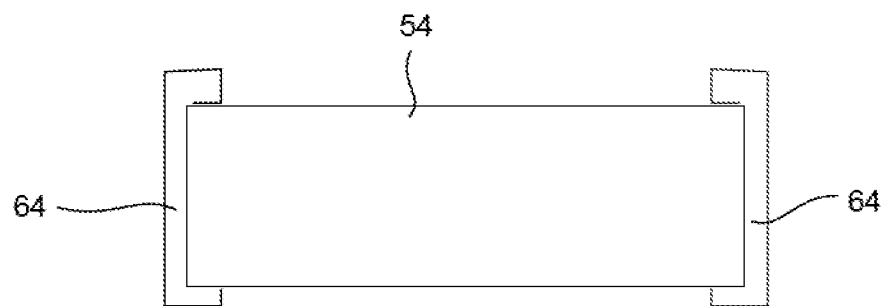
FIGS. 6A and 6B show embodiments of end caps for a glass enclosure.
Figure 6B:
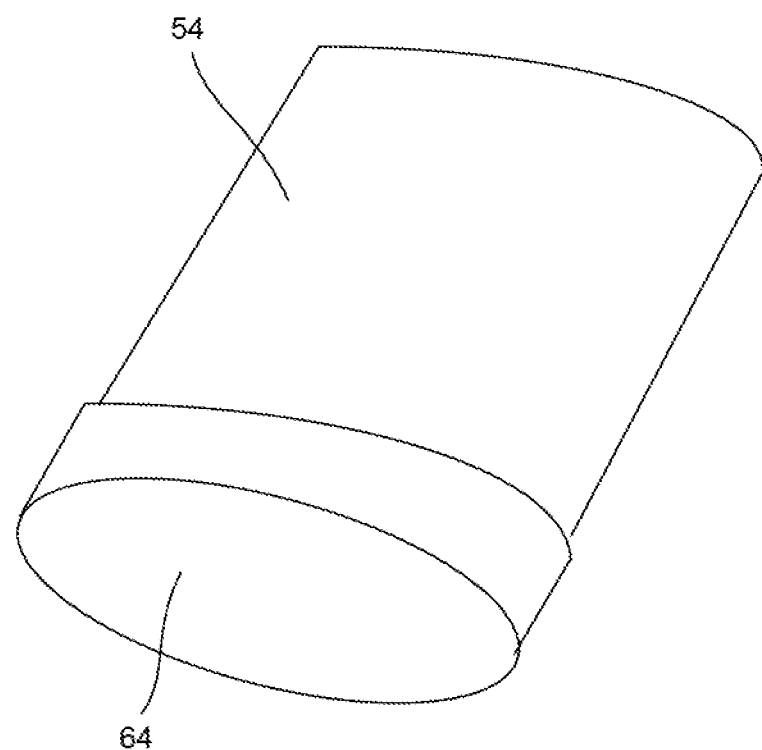

FIGS. 4-6 illustrate additional embodiments of end caps 64 for the glass main body 54. The end caps 64 can cover the open ends of the main body 54 in order to provide a fully contained housing 52. Although the end caps 64 can be applied in a variety or ways, in the particular embodiment shown in FIG. 4, the end caps 64 have a shape that coincides with the internal shape of the main body 54 such that a portion of the end caps 64 may be inserted into the open ends. In FIG. 5B, the end caps 64 do not fully cover the open ends, but do provide protection to the edge of the main body 54. In the embodiment shown in FIG. 5B, a feature, such as a door, can be used to fully cover an open end of the main body 54. FIG. 6B is a perspective view of an end cap 64 shown in the side view of FIG. 6A.

The cross-sectional shape, including both the outer and inner shapes, of the main body 54 may be widely varied. They may be formed from simple or intricate shapes, whether rectilinear and/or curvilinear. For hand held devices, it is typically preferred to use a shape that better fits the hand (e.g., form fits). By way of example, a rectangle with curved edges or an oval or pill shaped cross section having curvature that more easily receives the hand may be used. It should be noted that the inner cross-sectional shape may be the same or different from the external cross sectional shape of the main body. For example, it may be desirable to have a pill shaped external and a rectangular shaped interior, etc. In addition, although not a requirement, the front surface of the main body 54 may be substantially planar for placement of the user interface of the device 50.

Figure 7:
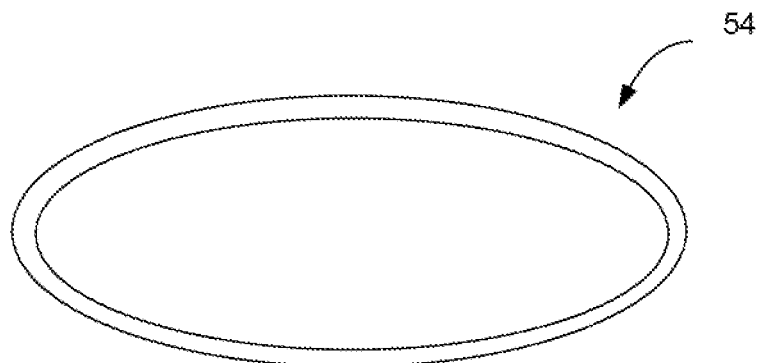
FIG. 7 is a side cross-sectional view of a glass enclosure having a wall with a continuous uniform thickness all around.
Figure 8:
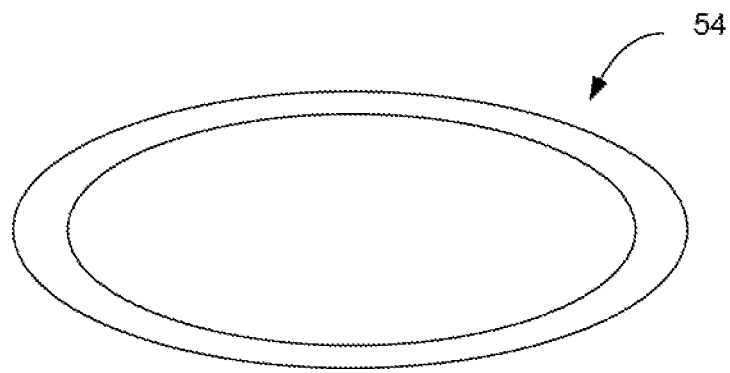
FIG. 8 is a side cross-sectional view of a glass enclosure having a wall with a thicker wall portion at the edge or corner portions.

In some embodiments, the main body 54 can have a wall having a continuous uniform thickness all around, as shown in FIG. 7. In other embodiments, as shown in FIG. 8, the wall of the main body 54 can be thicker at the edge or corner portions to provide strength in the areas where strength is more needed.

The seamless main body 54 can extend along a longitudinal axis, and can include an internal lumen that is sized and dimension for receipt of the internal components of the device 50 through an open end of the main body 54. The device 50 can also include one or more electronic subassemblies. The subassemblies can each include a carrier 68 and one or more operational components 70 of the electronic device 50. The carrier 68 can provide a structure for carrying the operational components 70 and supporting them when assembled inside the housing 52. By way of example, the carrier 68 may be formed from plastics, metals, or a printed circuit board (PCB). The operational components 70, on the other hand, perform operations associated with the computing device 50. The operational components 70 may, for example, include components such as user interface elements 70A and circuit elements 70B. The user interface elements 70A allow a user to interact with the computing device 50. By way of example, the user interface elements 70A may correspond to a display or an input device, such as a keypad, touch pad, touch screen, joystick, trackball, buttons, switches and the like. The circuit components 70B, on the other hand, perform operations, such as computing operations for the computing device 50. By way of example, the computing components 70B may include a microprocessor, memory, hard drive, battery, I/O connectors, switches, power connectors, and the like.

During assembly, the subassemblies are positioned inside the cavity 56 of the main body 54. In particular, the subassemblies can be inserted into an open end of the main body 54 mainly along a longitudinal axis 74 of the main body 54 to their desired position within the housing 52. Once the subassemblies are positioned inside the cavity 56, the end caps 64 of the housing 52 may be attached to the main body 54 in order to fully enclose the housing 52 around the subassemblies. In most cases, the user interface elements 70A are positioned relative to the window opening 62 so that a user may utilize the user interface elements 70A. By way of example, the window 62 may allow viewing access to a display or finger access to a touch pad or button. However, as discussed above, the glass main body 54 is capable of capacitive sensing, so a touch screen or a touch pad could be positioned underneath the glass enclosure without a window opening 62.

Figure 25:
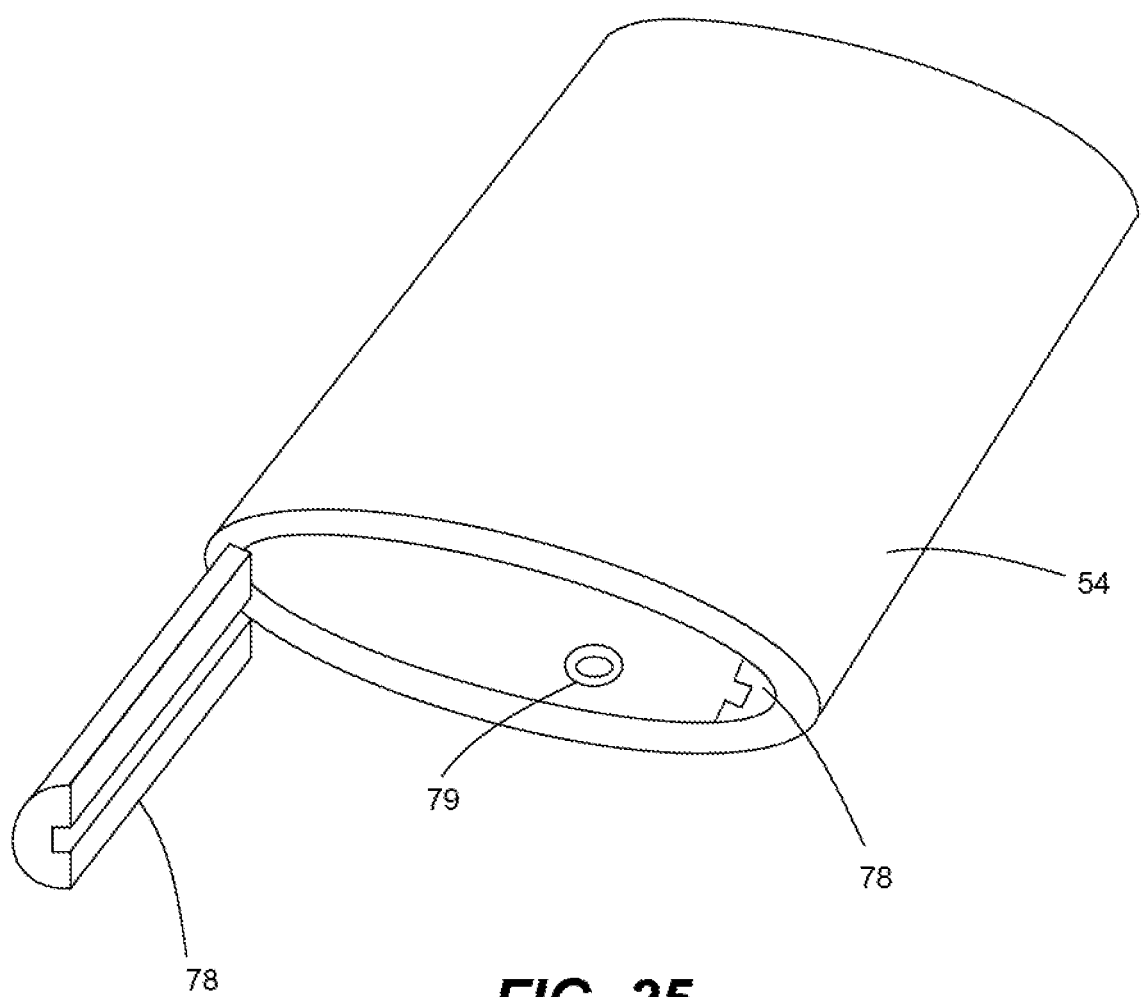
FIG. 25 shows an embodiment of a main body with rails that are adhered to and a screw boss molded into the main body.

In order to more efficiently assemble the electronic subassemblies 66 inside the cavity 56, the device 50 may include an internal rail system 78 disposed inside the cavity 56 of the main body 54. In most cases, the internal rail system 78 is integrally formed with the main body 54, i.e., formed as a single part. In some embodiments, as shown in FIG. 25, the rail system 78 can be adhered to the main body 54. Features, such the internal rails 80 and screw bosses 79, for mounting subassemblies can be adhered or molded into the main body 54.

The internal rail system 78 is configured to receive the various subassemblies and guide them to their desired position within the main body 54 when the subassemblies are inserted through one of the open ends. The internal rail system 78 enables the subassemblies to be easily and quickly assembled within the device 50. For example, the rail system 78 provides for insertion (or removal) with minimal effort and without tools. The internal rail system 78 also helps support and store the subassemblies in an organized manner within the device 50. By way of example, the rail system 78 may store the subassemblies in a stacked parallel arrangement thereby using available space more efficiently.

In the illustrated embodiment, the rail system 78 includes at least one set of opposed rails 80, each of which extends longitudinally through the cavity 56 and each of which protrudes from the inner sides of the main body 54. The rails 80 are configured to receive the subassemblies and cooperate to guide subassemblies to their desired position within the housing 52. The internal rails 80 generally allow the subassemblies to be slid into the cavity 56 through an open end following the longitudinal axis 74 of the main body 54. That is, the subassemblies are capable of sliding in and out of the housing 52 along one or more surfaces of the rails 80.

The portion of the subassemblies that engages the rails 80 may be a surface of the subassemblies or alternatively one or more posts or mounts that extend outwardly from the subassemblies. Furthermore, the reference surfaces for the opposed rails 80 may be positioned in the same plane or they may be positioned in different planes. The configuration generally depends on the configuration of the subassemblies. By way of example, in some cases, the subassemblies may have a cross section that is stepped rather than completely planar. In cases such as these, the opposed rails 80 have references surfaces in different planes in order to coincide with the stepped cross section. Moreover, although typically continuous between the ends, each of the rails 80 may be segmented or include removed portions as for example at the ends for placement of the flush mounted end caps.

The width of the rails 80 may be widely varied. For example, they may be one integral piece that extends entirely from one side to the other, or they may be separate pieces with a gap located therebetween (as shown). The position and cross sectional dimensions and shapes of each of the rails may also be widely varied. The size and shape as well as the position of the rails 80 generally depend on the configuration of the subassemblies. The rails 80 may have the same shape and size or they may have different shape and size. In most cases, the size and shape is a balance between keeping them as small as possible (for weight and space requirements) while providing the required reference surface and ample support to the subassemblies.

To elaborate, the rails 80 define one or more channels 82 that receive the one or more subassemblies. In the illustrated embodiment, the rails 80 along with the main body 54 define a pair of channels, particularly an upper channel 82A and a lower channel 82B. The upper channel 82A receives a first subassembly 66A and the lower channel 82B receives a second subassembly 66B. It should be noted, however, that this is not a limitation and that additional sets of rails 80 may be used to produce additional channels 82. It should also be noted that although only one subassembly is shown for each channel 82, this is not a requirement and that more than one subassembly may be inserted into the same channel 82.

Moreover, it should be noted that the subassemblies are not limited to being fully contained with a single channel and that portions of a subassembly may be positioned in multiple channels. For example, the second subassembly 66B, which is positioned in the lower channel 82B, may include a protruding portion that is positioned through the rails 80 and into the upper channel 82A.

The channels 82 generally include an entry point and a final point. The entry point represents the area of the channel 82 that initially receives the subassemblies 66, i.e., the area proximate the ends of the main body 54. The final point, on the other hand, represents the area of the channel 82 that prevents further sliding movement. The final point may, for example, set the final mount position of the subassemblies 66 within the housing 52. The final point may, for example, correspond to an abutment stop. The abutment stop may be integral with the main body 54 or a separate component. By way of example, the abutment stop may correspond to one more posts that are mounted inside the cavity 56 on the inside surface of the main body 54 at a predetermined distance along the longitudinal axis 74.

In order to prevent the subassemblies 66 from sliding once assembled, the interface between the subassemblies 66 and housing 52 may include a locking or securing mechanism. The locking mechanism generally consists of two parts, including a housing side locking feature and a subassembly side locking feature that are cooperatively positioned so that when the subassembly 66 is inserted into the housing 52, the locking features engage with one another thus holding the subassembly 66 in its desired position within the housing 52. In most cases, the locking features are configured to provide quick and easy assembly of the subassembly into the housing without the use of tools. The locking features may correspond to snaps, friction couplings, detents, flexures and/or the like. Alternatively or additionally, the subassemblies 66 may be attached to the main body 54 with fasteners or adhesives. In other embodiments, the operational components 70 can be directly secured to the main body 54.

In the illustrated embodiment, the locking features of the subassemblies 66 each include a flexure tab 88 that engages a recess 90 located on an inner surface of the main body 54. When the subassembly 66 is slid into the housing 52, the tab 88 snaps into the recess 90 thereby securing the subassembly 66 at a predetermined position along the longitudinal axis 74. That is, because the tabs 88 flex, they allow the subassemblies 66 to pass when pushed into the cavity 76. When the subassemblies 66 pass over the recess 90, the tabs 88 resume their natural position thereby trapping the subassemblies 66 in the channel 82 between the locking tab/recess 88/90 and the abutment stop at the end of the channel 82. Using this arrangement, the subassemblies 66 are prevented from sliding out of the channels 82 on their own. In order to remove the subassembly 66, a user simply lifts the tab 88 away from the recess 90 while pulling on the subassembly 66. The recess 90 and abutment stop may cooperate to set the final position of the subassembly 66 in the cavity 56 of the main body 54. For example, the recess and abutment stop may be configured to position the user interface elements 70A directly behind the window opening 62 so that a user has full access to the user interface elements 70A.

Figure 18:
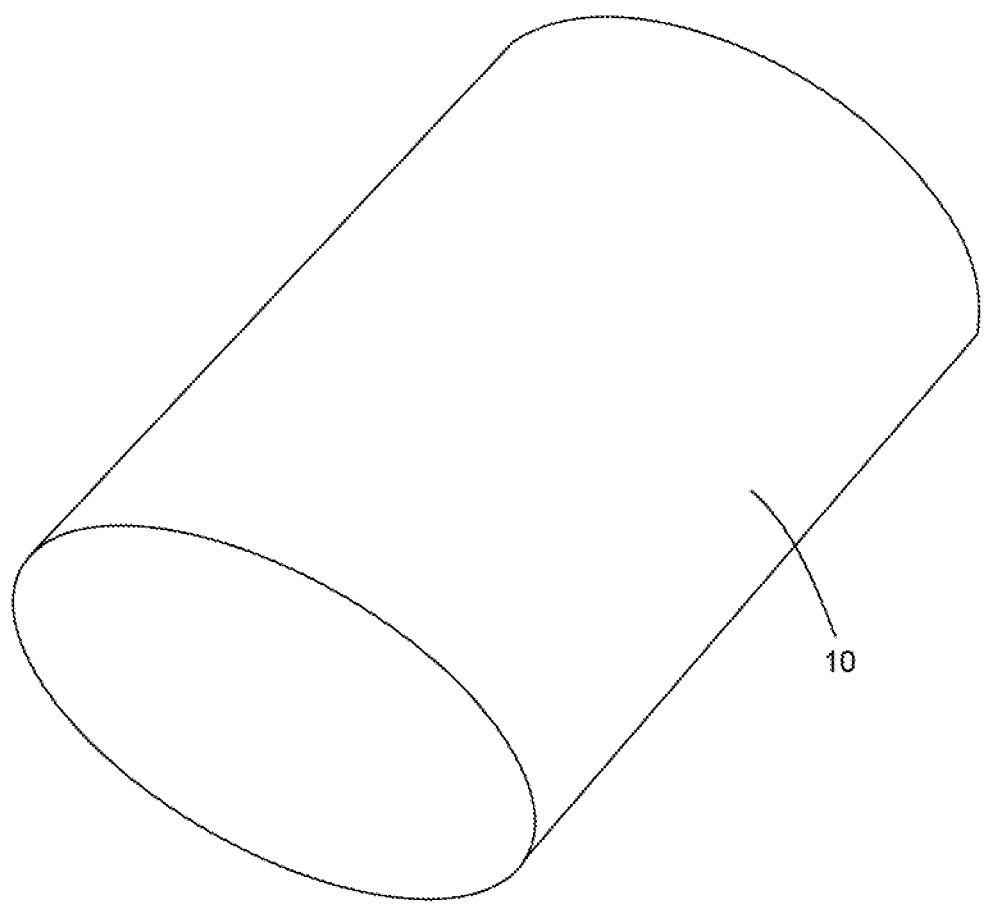
FIG. 18 is a perspective view of a solid block of glass prior to being formed into a glass enclosure.

In accordance with one embodiment, the main body 54, which may include the internal rails 80 (or other internal features), is formed via an extrusion or extrusion-like process. The process is capable of producing an integral tube without seams, crack, breaks, and the like. As is generally well known, extrusion of conventional materials, such as metals and plastics, is a shaping process where a continuous work piece (i.e., a solid block of glass 10 as shown in FIG. 18) is produced by forcing molten or hot material through a shaped orifice. The extrusion process produces a length of a particular cross sectional shape. The cross-sectional shape of the continuous or length of the extruded work piece is controlled at least in part on the shaped orifice. As the shaped work piece exits the orifice, it is cooled and thereafter cut to a desired length.

Figure 9:
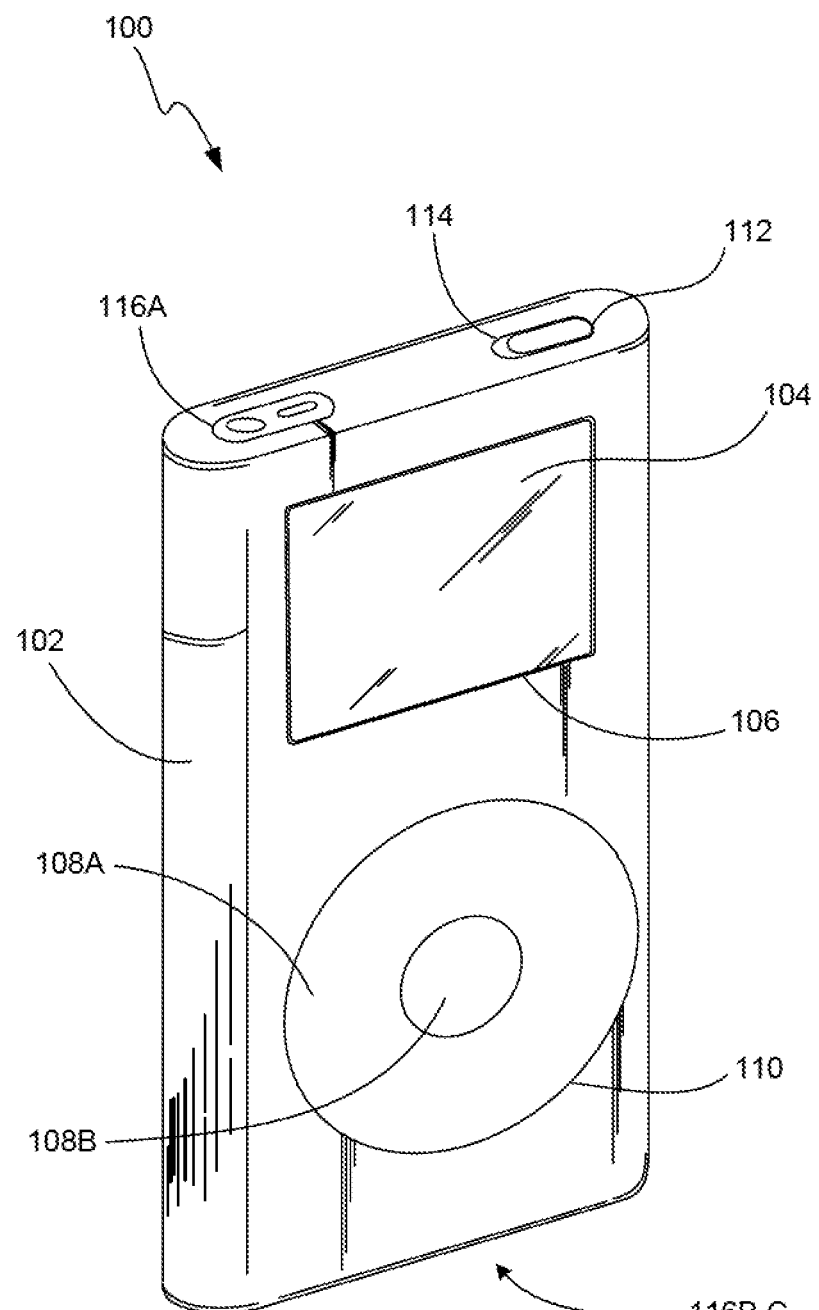
FIG. 9 is a perspective diagram of a handheld computing device, in accordance with one embodiment.

FIG. 9 is a perspective view of a handheld computing device 100, in accordance with one embodiment. By way of example, the computing device 100 may generally correspond to the device 50 shown and described in FIG. 1. The computing device 100 is capable of processing data and more particularly media, such as audio, video, images, and the like. By way of example, the computing device 100 may generally correspond to a music player, game player, video player, camera, cell phone, personal digital assistant (PDA), and the like. With regard to being handheld, the computing device 100 can be operated solely by the user's hand(s), i.e., no reference surface, such as a desktop, is needed. In some cases, the handheld device is sized for placement into a pocket of the user. By being pocket sized, the user does not have to directly carry the device and therefore the device can be taken almost anywhere the user travels (e.g., the user is not limited by carrying a large, bulky and heavy device). In the illustrated embodiment, the computing device 100 is a pocket-sized hand held music player that allows a user to store a large collection of music. By way of example, the music player may correspond to the iPod series MP3 players, including for example the iPod Mini™ and iPod Nano™ manufactured by Apple Inc. of Cupertino, Calif.

As shown, the computing device 100 includes a housing 102, which can be formed of glass, which encloses and supports internally various electrical components (including integrated circuit chips and other circuitry) to provide computing operations for the device. The integrated circuit chips and other circuitry may include a microprocessor, hard drive, Read-Only Memory (ROM), Random-Access Memory (RAM), a battery, a circuit board, and various input/output (I/O) support circuitry. In addition to the above, the housing 102 may also define the shape or form of the device 100. In this particular illustrated embodiment, the housing 102 extends longitudinally and has a pill like cross section. The size and shape of the housing 102 is preferably dimensioned to fit comfortably within a user's hand. In one particular embodiment, the housing is formed from a glass material and has a seamless or substantially seamless look along the length of the device 100. That is, unlike conventional housings, the housing 102, particularly the main body, does not include any breaks between the top and bottom ends, thereby making it stiffer and more aesthetically pleasing.

The computing device 100 can also include a display screen 104. The display screen 104, which is assembled within the housing 102 and which can be visible through the glass housing 102 or can be positioned in a window 106, can be used to display a graphical user interface (GUI) as well as other information to the user (e.g., text, objects, graphics). The display screen 104 can also employ touch screen technology. As noted above, the glass material of the housing 102 allows the display screen 104 to be positioned underneath and protected by the glass housing 102. The glass material of the housing 102 is also capable of capacitive sensing so that a touch screen or touch pad can be used through the glass housing 102.

The computing device 100 can also include one or more input devices 108 configured to transfer data from the outside world into the computing device 100. The input devices 108 may, for example, be used to perform tracking or scrolling to make selections or to issue commands in the computing device 100. By way of example, the input devices 108 may correspond to keypads, joysticks, touch screens, touch pads, track balls, wheels, buttons, switches, and the like. In the embodiment illustrated in FIG. 9, the computing device 100 includes a touch pad 108A and one or more buttons 108B, which are assembled within the housing 102 and which are accessible through an opening 110 in the housing 102.

The touch pad 108A generally consists of a touchable outer surface 111 for receiving a finger for manipulation on the touch pad 100A. Although not shown, beneath the touchable outer surface 111 is a sensor arrangement. In an embodiment, the sensor arrangement may be positioned directly underneath the glass enclosure without the touchable outer surface 111, as the glass is capable of capacitive sensing and can act as the touchable outer surface. The sensor arrangement includes a plurality of sensors that are configured to activate as the finger passes over them. In the simplest case, an electrical signal is produced each time the finger passes a sensor. The number of signals in a given time frame may indicate location, direction, speed and acceleration of the finger on the touch pad, i.e., the more signals, the more the user moved his or her finger. In most cases, the signals are monitored by an electronic interface that converts the number, combination and frequency of the signals into location, direction, and speed and acceleration information. This information may then be used by the device 100 to perform the desired control function on the display screen 104.

The buttons 108B are configured to provide one or more dedicated control functions for making selections or issuing commands associated with operating the device 100. In most cases, the button functions are implemented via a mechanical clicking action although they may also be associated with touch sensing similar to the touch pad 108A. The position of the buttons 108B relative to the touch pad 108A may be widely varied. Several touch pad/button arrangements, which may be used in the device 100, are described in greater detail in U.S. patent application Ser. Nos. 10/643,256, 10/188,182, 10/722,948, which are all hereby incorporated by reference herein in their entireties. The computing device 100 can also include one or more switches 112, including power switches, hold switches, and the like. Like the touch pad 108A and buttons 108B, the switches 112 can be accessible through a second opening 114 in the housing 102.

The device 100 may also include one or more connectors 116 for transferring data and/or power to and from the device 100. In the illustrated embodiment, the device 100 includes an audio jack 116A, a data port 116B and a power port 116C. In some cases, the data port 116B may serve as both a data and power port thus replacing a dedicated power port 116C. A data port such as this is described in greater detail in U.S. patent application Ser. No. 10/423,490, which is hereby incorporated by reference herein in its entirety.

Figure 10:
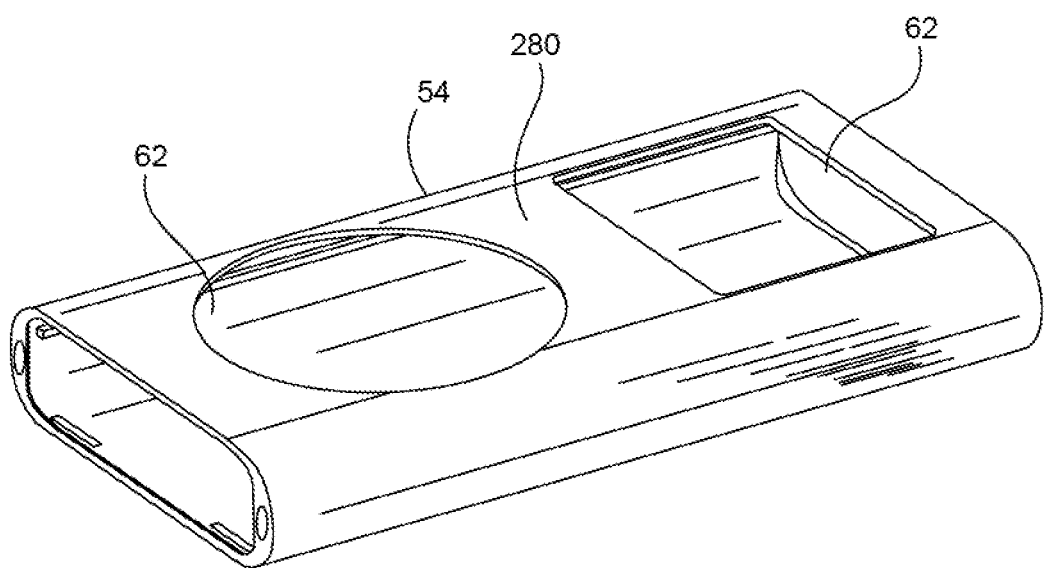
FIG. 10 is a front perspective view of a glass seamless enclosure, in accordance with one embodiment.

In order to provide user access to an input assembly, such as a touch pad or touch screen display, the glass main body 54 can include an access opening or window 62 having a shape that coincides with the shape of the input assembly. As shown in FIG. 10, the access openings 62 for the display and touch pad can be located in the front planar surface 280. The access openings 62 may be formed from processes (individually or in combination), such as machining, drilling, cutting, punching, and the like. In embodiments having the access openings 62, some of the operational components may be loaded into the enclosure through the access openings 62.

Figure 22:
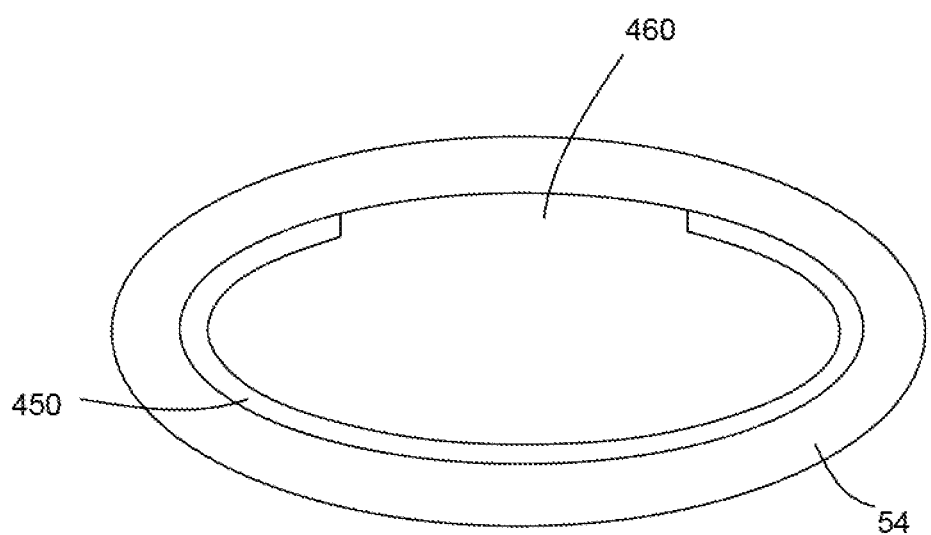
FIG. 22 is a side cross-sectional view of a glass main body with ink printing or back printing to achieve opacity around a display.

As noted above, the access openings 62 may provide user access to components, such as displays, touch pads, and buttons. Another way to provide access to a display is through the transparent glass enclosure. However, it can be appreciated that it is generally not desirable for the entire enclosure to be transparent because the internal operational components are usually not aesthetically pleasing. Thus, as discussed above, opacity (or translucency) around components, such as displays, is desirable. One way to achieve opacity is by ink printing or back printing the glass, as described above. FIG. 22 is a side cross-sectional view of a glass main body 54 with ink printing or back printing 450 to achieve opacity around a display. As shown in FIG. 22, the printing 450 does not go all the way around the main body 54 so as to leave an area or transparency 460 for the display.

Figure 11:
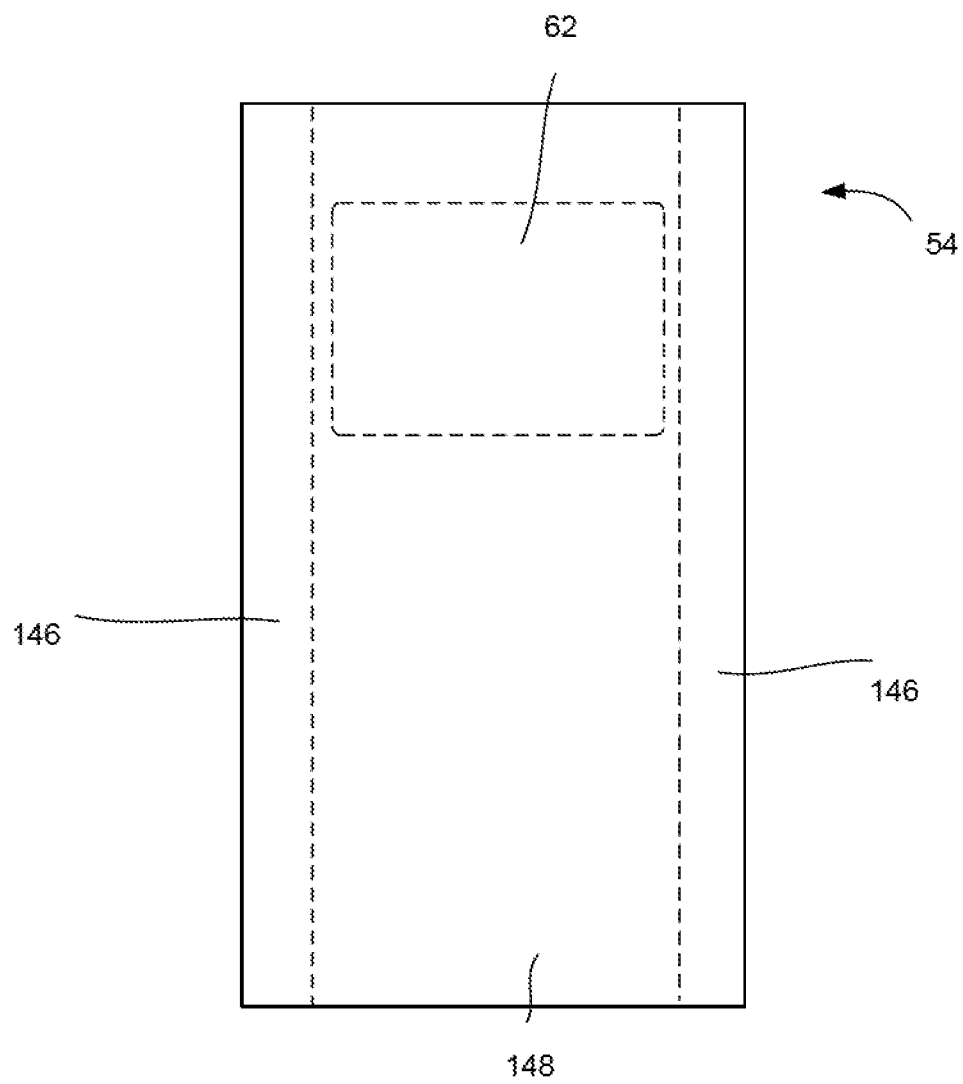
FIG. 11 is a top plan view of a glass enclosure co-extruded with both an opaque material and a transparent material, in accordance with one embodiment.

Another way to achieve opacity around a display or other component is to form the main body 54 by co-extruding an opaque glass material 146 together with a transparent glass material 148, as shown in FIG. 11. The dotted lines in FIG. 11 illustrate the separation between the opaque material 146 and the transparent material 148. As shown in FIG. 11, the access opening or window 62 for the display is in the transparent material 148 portion.

Figure 12:
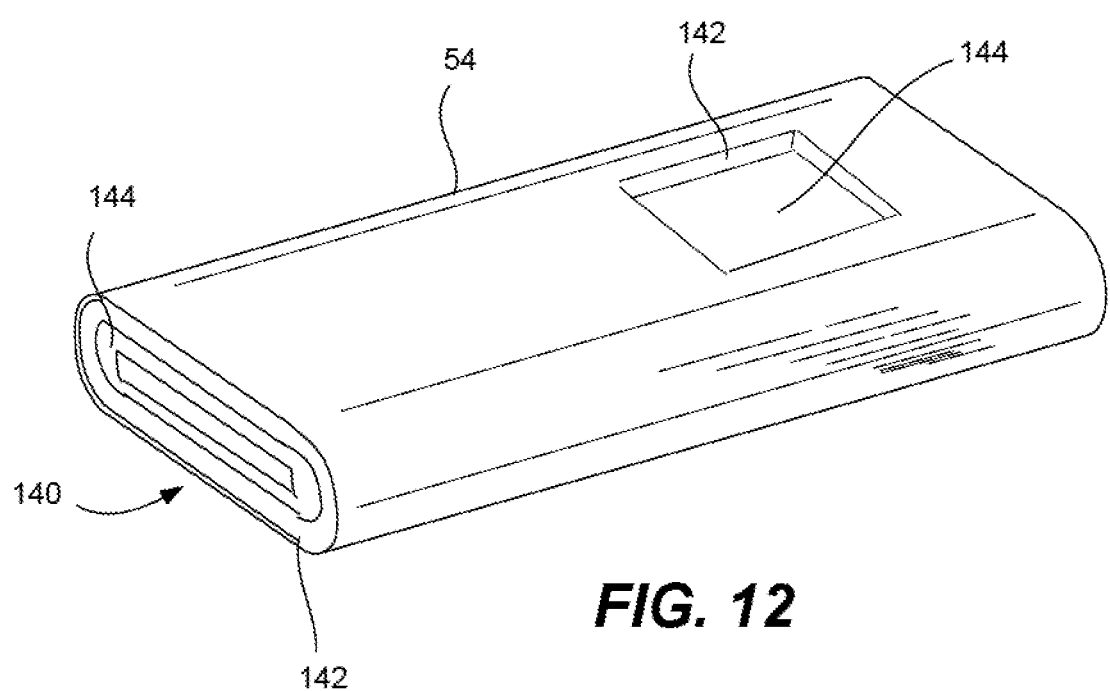
FIG. 12 is a perspective view of a two-layer clad glass enclosure.

Yet another way to achieve opacity around a component, such as a display, is to use a two-layer clad glass 140 for the main body 54, as shown in FIG. 12. The clad glass 140 is formed by fusing together a layer of opaque glass material 142 and a layer of transparent glass material 144 at a high temperature. The two layers 142, 144 will cool as a single fused layer. If the opaque glass material 142 is positioned as the external layer and the transparent glass material 144 is positioned as the internal layer, then a portion of the opaque glass 142 can be etched, or otherwise removed, to expose a portion of the transparent glass 144 underneath to form a window for the display.

Another benefit of using a two-layer clad glass 140 is that the enclosure can be made stronger if the glass includes two layers having different coefficients of thermal expansion (CTE). If the external layer has a high CTE and the internal layer has a low CTE, then the two layers 142, 144 will fuse into one layer, with the external surface glass layer 142 being in a compressive state. The skilled artisan will appreciate that glass is stronger in compression and weaker in tension, and the different cooling rates of the two layers of glass will result in the external surface layer 142 being in compression and therefore stronger.

Typically, a sheet of glass can be made stronger by chemically strengthening it. For example, the glass can be placed in a potassium bath to cause the entire surface of the glass to be in a compressed state and therefore stronger. Thus, a glass enclosure, as described herein, having a single layer of glass material could be chemically treated to improve the strength of the glass. However, potassium baths are expensive, so using a two-layer clad glass with layers that have different CTEs can provide cost savings. Thus, by using a two-layer clad glass 140, opacity in desired portions can be achieved and the glass enclosure can be made stronger without employing an expensive potassium bath.

Figure 24:
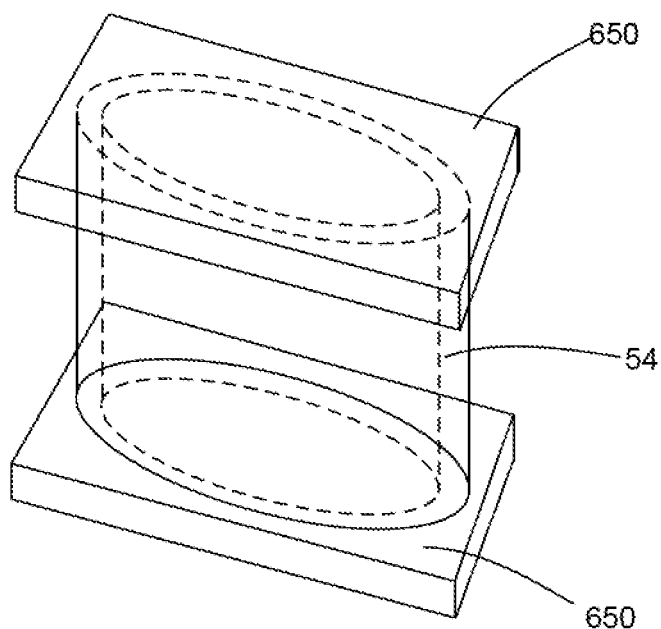
FIG. 24 is a perspective view of a method of sealing of the interior of a glass enclosure to achieve a thicker surface layer in compression in a chemical strengthening process in accordance with an embodiment.

FIG. 24 is a perspective view illustrating a method of sealing of the interior of a glass enclosure to achieve a thicker surface layer in compression in a chemical strengthening process, in accordance with an embodiment. According to this embodiment, a thicker layer of compression on the external surface of the glass main body 54 is achieved. This thicker layer of compression on the external surface is relative to the internal surface of the main body 54. In the illustrated embodiment, the external surface of the glass main body 54 can be made even stronger by sealing the open ends of the main body 54 to close off the interior of the main body 54 with seals 650 and placing the sealed off glass main body 54 in a potassium bath to compress only the exterior of the tube and not the interior. By compressing only the external surface of the glass main body 54 so that the interior of the main body 54 remains not chemically strengthened, a thicker layer of compression on the external surface can be achieved. It will be understood that any suitable method for sealing off the interior may be employed to achieve a thicker layer of compression on the external surface.

Although not shown, the internal components may also include components for processing, transmitting and receiving wireless signals (e.g., transmitter, receiver, antenna, etc.) through the glass enclosure 54. By way of example, the device may include components for supporting FM, RF, Bluetooth, 802.11, and the like. In one embodiment, the device can include functionality for supporting cellular or mobile phone usage. In this embodiment, the device includes processors, transmitters, receivers, and antennas for supporting RF, and more particularly GSM, DCS and/or PCS wireless communications in the range of about 850 to about 1900 MHz. The device may, for example, include one or more antennas tuned to operate over the GSM, PCS and/or DCS frequency bands. By way of example, monopole, dipole and tri band and quad band antennas may be used. In one example, a PCS+DCS dipole antenna is used. The antenna may protrude out of the enclosure or it may be fully enclosed by the enclosure. If the latter, the glass enclosure is radio transparent and therefore capable of transmitting and receiving RF signals therethrough.

As described above, the main body of the enclosure can be formed from a glass material that is radio-transparent. By utilizing a glass enclosure that is radio-transparent, an internal antenna may be used, which is typically more robust and durable than an external antenna. Furthermore, many advantages regarding the use of an internal antenna may be achieved. For example, a smaller and cheaper antenna may be used. Moreover, the antenna can be integrated with other components and placed at almost any location within the enclosure, which helps make a smaller and more compact device in addition to reducing the cost of manufacture. An example of wireless communication devices and mechanisms can be found in U.S. patent application Ser. No. 10/423,490, which is hereby incorporated by reference herein in its entirety.

Figure 21:
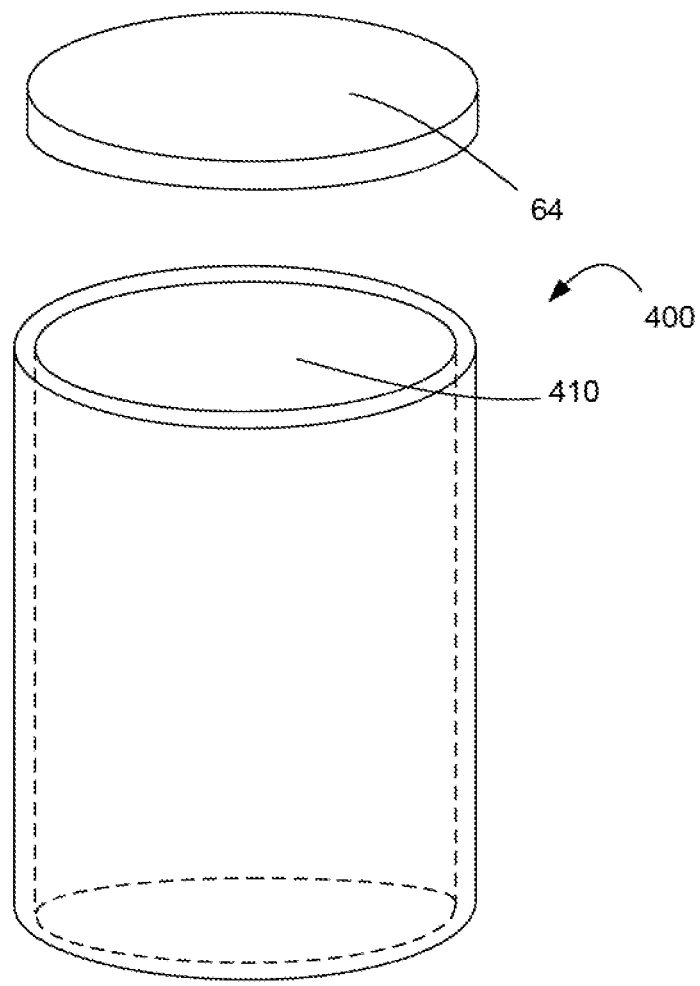
FIG. 21 is a perspective view of an embodiment of a glass enclosure made by a deep drawn blow molding process.

In another embodiment shown in FIG. 21, the glass enclosure 400 can be formed using a deep drawing and a blow molding process. The deep drawing and blow molding processes result in a bucket or cup-like glass enclosure 400 with only one open end 410, as shown in FIG. 21. Therefore, only one end cap 64 is necessary to close off or seal such housing.

Figure 13:
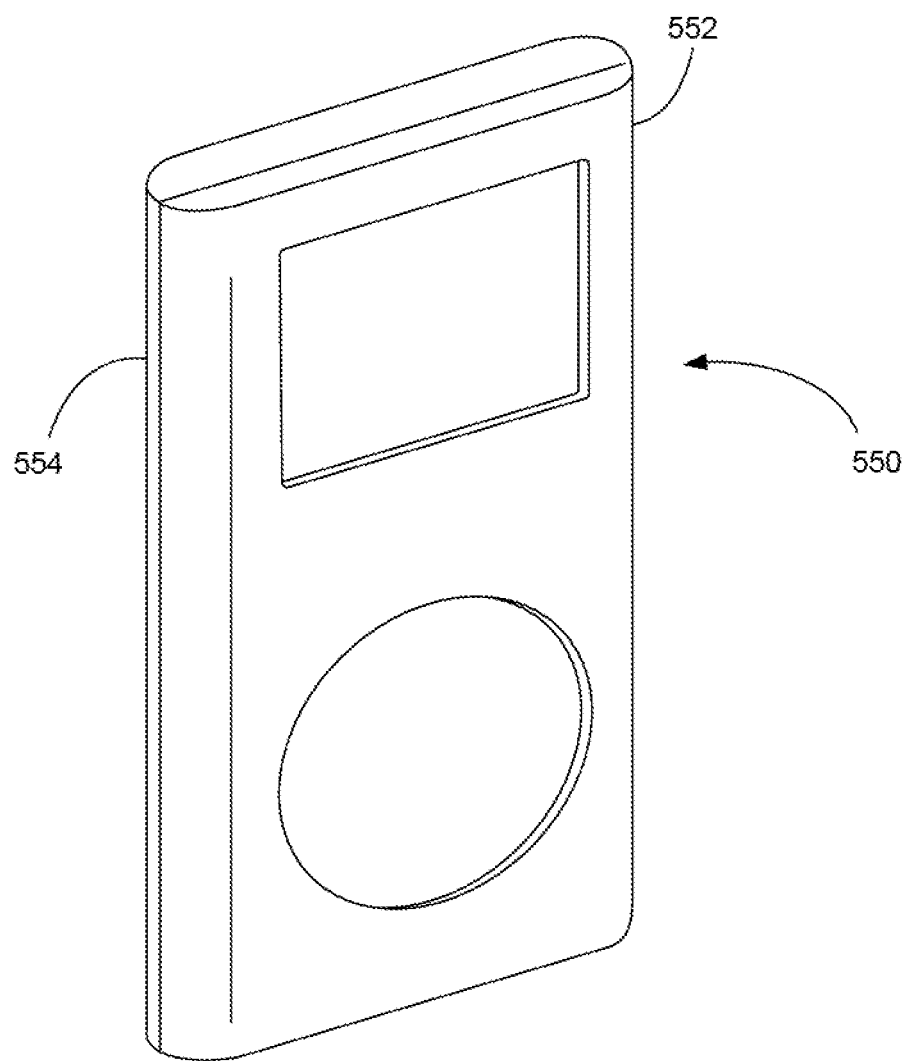
FIG. 13 is a front perspective view of an embodiment of an electronic device having an enclosure formed from two glass members bonded together.

FIG. 13 shows one embodiment of an enclosure 550 that includes a top member 552 with a bottom member 554 attached thereto. The top and bottom members 552 and 554 can be formed from the same or different materials. In one embodiment, the top and bottom members 552, 554 are both formed of glass. As should be appreciated, any combination can be used. Furthermore, this design can be made with or without using end caps. For example, the top and bottom members may include a closed end. According to the embodiment shown in FIG. 13, the two members 552, 554 allow components to be assembled onto the members 552, 554 before the two members 552, 554 are bonded together using, for example, an adhesive or laser frit bonding. For example, if both members 552, 554 are glass, the laser frit bonding may be employed to hermetically seal the two members 552, 554 together to form the enclosure 550. Ink printing or back painting to achieve opacity in certain areas can also be performed prior to assembling the components and bonding the members 552, 554 together. After the two members 552, 554 are bonded together; the enclosure 550 can be polished so that the enclosure 550 has a more continuous and substantially seamless appearance. If no openings are provided in the enclosure 550, then a laser frit bonded enclosure 550 can be fully hermetically sealed and therefore water resistant, as will be described in more detail below.

Figure 14A:
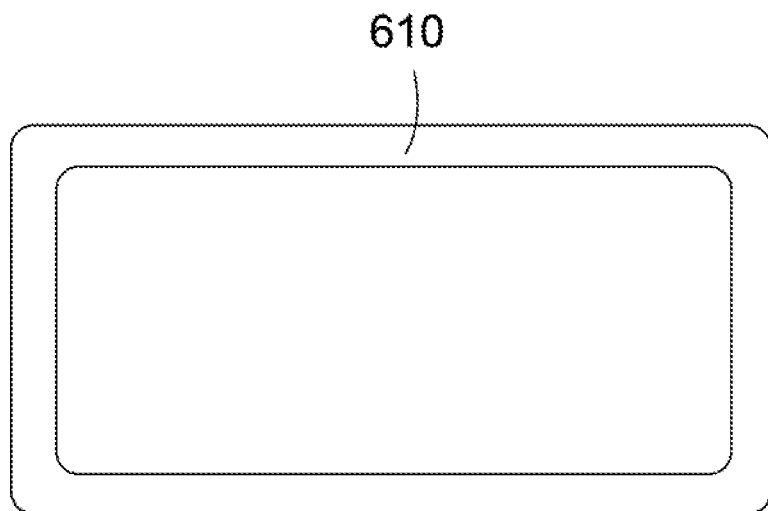
FIGS. 14A and 14B are a top plan view and perspective view of a glass band, respectively.
Figure 14B:
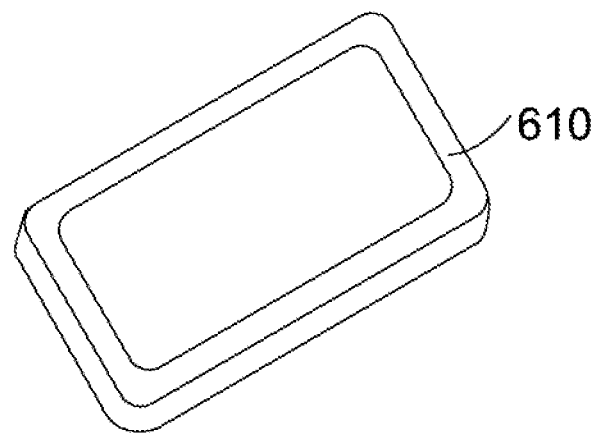

FIGS. 14A and 14B are a top plan view and perspective view of a glass band 610 according to an embodiment. According to an embodiment, the glass band 610 is formed by an extrusion process and then cut to the desired height. In the illustrated embodiment shown in FIG. 15, to form the housing 600, the glass band 610 is laser frit bonded to two flat pieces of glass: a cover glass 620 and a back glass 630 to form a hermetic seal. In another embodiment, the glass band 610 can be bonded to a cover glass 620 and a back plate (not shown).

Figure 15:
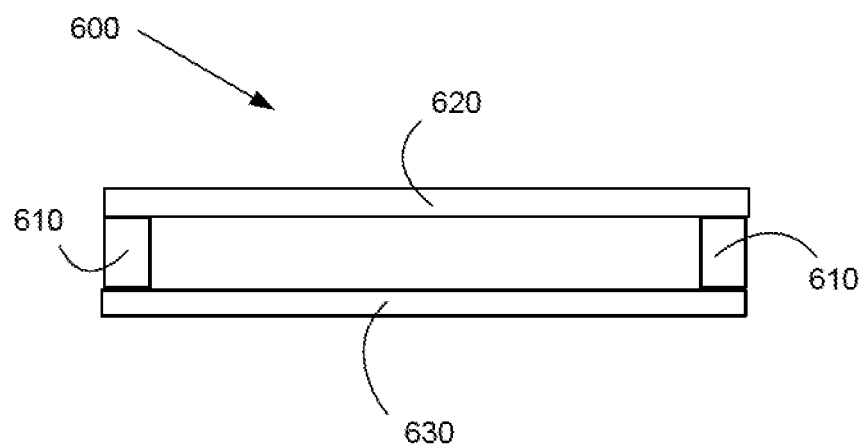
FIG. 15 is a side cross-sectional view of a glass enclosure with two flat pieces of glass bonded to the glass band shown in FIG. 14.

Because the cover glass 620 and back glass 630 are laser frit bonded to the glass band 610, the embodiment of the housing 600 shown in FIG. 15 can be made fully hermetically sealed if the housing 600 is not provided with any access openings. As discussed above, the glass housing is capable of capacitive sensing, so components such as touch screens and touch pads can be positioned underneath the glass enclosure. Other controls, such as buttons for volume control or power, can also be positioned underneath the glass enclosure by placing capacitive sensors underneath the glass housing so that openings for buttons are unnecessary. Speakers and microphones may be provided with a GORETEX® membrane, which is waterproof. The device can send and receive signals using wireless signals, which can be transmitted through the radio transparent glass housing 600.

Figure 16A:
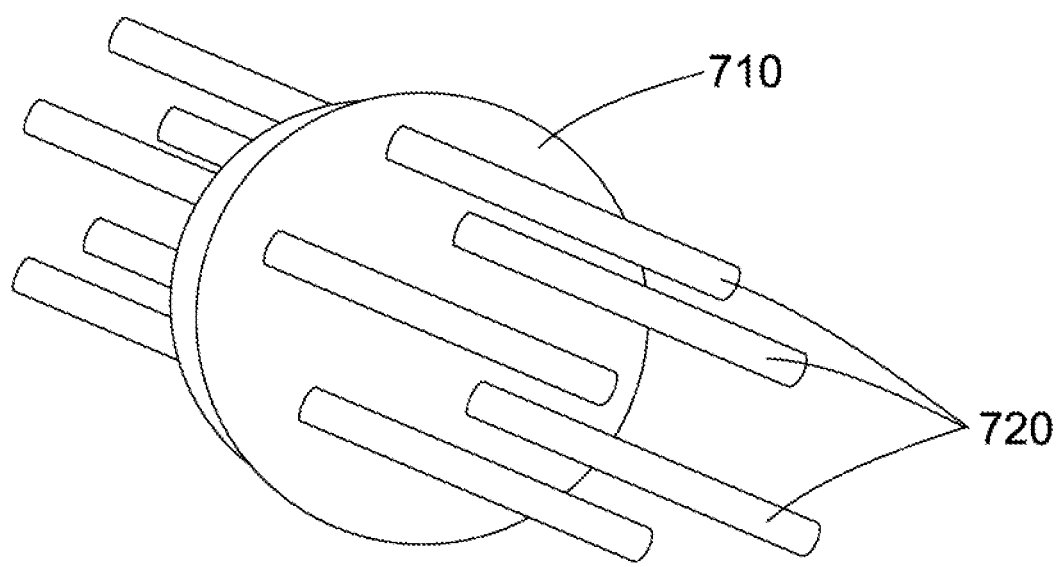
FIG. 16A is a perspective view of a ceramic disk formed around several metal rods for forming a water-resistant audio jack in accordance with an embodiment.
Figure 16B:
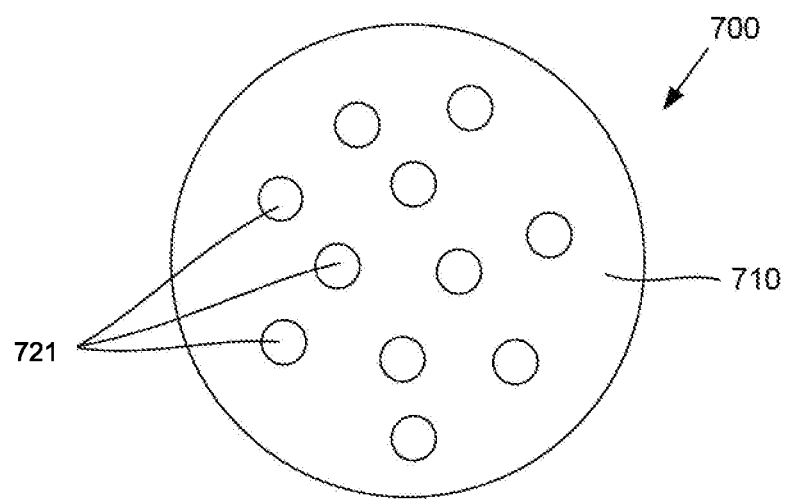
FIG. 16B is a top plan view of the water-resistant audio jack shown in FIG. 16A.

If a method of transferring electric signals through an impermeable wall is desired for the embodiment shown in FIG. 15, a component such as the one shown in FIG. 16 can be provided to maintain the water resistant characteristic of the device. The electrical signal transferring component 700 is made by forming a ceramic disk 710 around several metal rods 720, as shown in FIG. 16A. These metal rods are then shaved down or machined away to leave metal contacts 721 in the ceramic disk, thereby forming the water resistant audio jack, as shown in FIG. 16B. It will be understood that the metal contacts 721 serve as electrical contacts. The component 700 can be used to receive signals from an audio jack and pass them into a water-resistant device, such as the one shown in FIG. 15, such that no water can get through this geometry, but the electric signals can.

According to another embodiment, a display screen can be built into the glass enclosure. LCDs are typically formed with a carrier. However, the glass enclosure can be used as the carrier for the display, thereby decreasing the bulk of the device. It will be understood that such a display screen can only be built into an enclosures formed by bonding together two members, such as the one illustrated in FIG. 13.

It should be noted that the invention is not limited to this particular form factor. For example, the cross-sectional shape, width, thickness, and height of the enclosure can all be adjusted according to the needs of the device. For example, in some cases, the width and thickness may be reduced while increasing the height. In addition, the openings in the enclosure can also be modified and may take on other shapes. For example, the touch pad circle may be decreased in diameter. In one example, the enclosure may have dimensions similar to the iPod Nano manufactured by Apple Inc. of Cupertino, Calif.

It should also be noted that completely different form factors may be used. For example, the device may correspond to smaller more compact devices, such as the Shuffle and remote controls manufactured by Apple Inc. of Cupertino, Calif.

Figure 17:
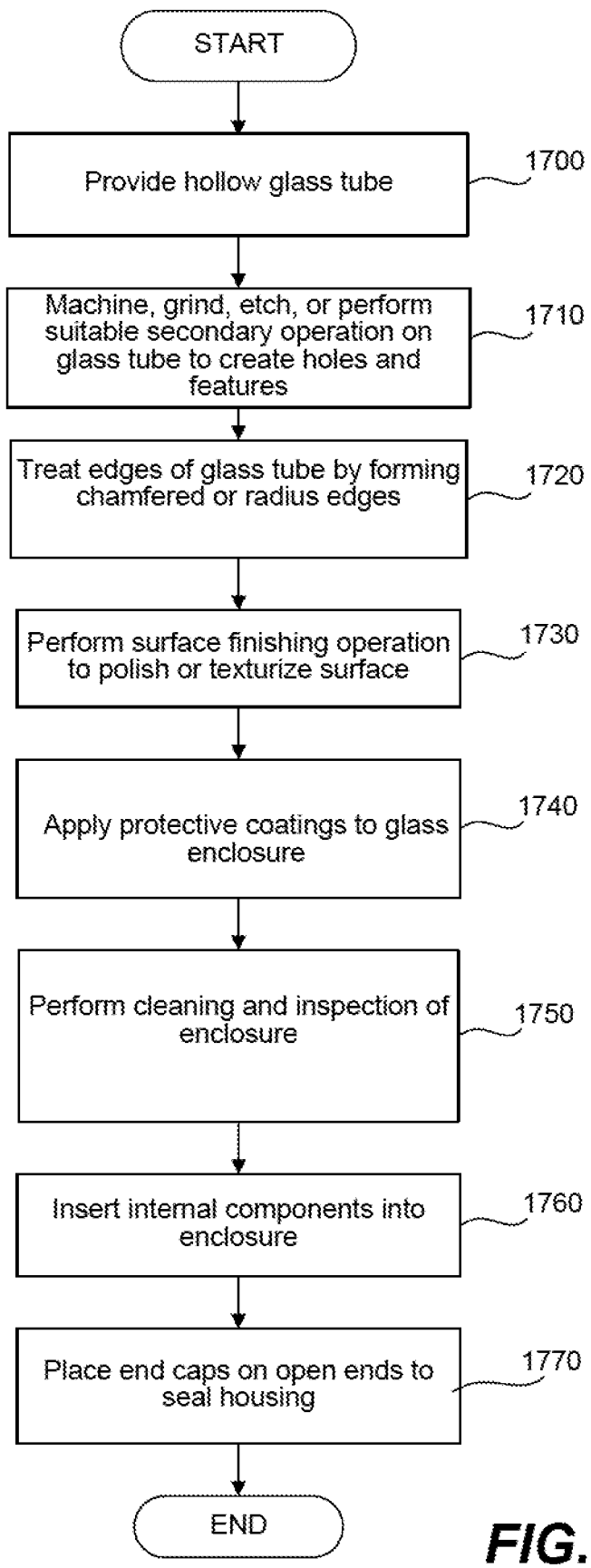
FIG. 17 is a method of manufacturing an electronic device with a glass enclosure, in accordance with one embodiment.

FIG. 17 is a method of manufacturing an electronic device with a glass enclosure, in accordance with one embodiment. The glass enclosure may be embodied in various forms including those previously mentioned. The method begins at block 1700, where a hollow glass tube is provided. It will be understood that the glass may be tinted a desired color or made opaque or translucent in certain areas. The tube can have any cross-sectional shape to create the desired shaped enclosure formed from glass.

Thereafter, in block 1710, the glass enclosure can be machined to create holes and features into the enclosure, such as, for example, the openings in the front face of the enclosure. For example, a CNC machine may be used to perform some or all of the machining operations. Alternatively, the openings and features may be made with laser cutting, jet cutting, ultrasonic cutting, chemical etching, or any other suitable material removal operation.

Thereafter, in block 1720, the edges of the glass tube are treated by creating chamfered or radius edges. In block 1730, a surface finishing operation may be performed. In one embodiment, a polishing operation can be performed to create a smooth (gloss) finish. In another embodiment, a blasting operation can be performed to create a rough (matte) finish.

In some cases, the method may include an additional step 1740 of applying a protective coating or protective features to the outside of the glass enclosure. This may be performed before or after placement of the internal components. The coatings or features may, for example, be formed from deformable materials, such as silicon, foam and rubber materials. The coatings or protective features are typically positioned on the exterior surface to prevent cracking and protect the glass enclosure from undesirable forces as, for example, when the glass enclosure is dropped. The coatings and protective features can be placed almost anywhere on the glass enclosure, but in most cases are placed at least at the edges where the glass enclosure may be susceptible to cracking. In some cases, the end plates may even serve this function.

The method then proceeds to block 1750 where the enclosure is cleaned and inspected. The inspection may include micro photography as well as chemical composition analysis. When approved, the enclosure can be used to assemble the final product (e.g., internal components inserted inside) in block 1760. In step 1770, the end caps are placed on the open ends to seal the housing.

Although the invention has been primarily directed at a single enclosure (except for the end plates), it should be appreciated that, in some cases, the enclosure may be formed from multiple parts rather than a single integrally formed piece. Each of these parts may be extruded or otherwise formed. Furthermore, they may be formed from the same materials (glass/glass), same class of materials (first glass material/second glass material) or from different classes of materials (glass/metal, glass/plastic, plastic/metal or glass/plastic/metal). By way of example, it may be beneficial to combine materials to obtain advantages of each of the materials. Any combination may be used. Moreover, the multiple parts may include frame components with plates attached thereto, or a top member and a bottom member that are attached together. The attachment means may be widely varied and may include such things as fasteners, glues, epoxies, double sided tape, snaps, mechanical interlocks that are molded together, and the like. One example of connecting parts together can be found in U.S. Pat. No. 7,012,189 and U.S. application Ser. No. 10/928,780, both of which are hereby incorporated by reference herein in their entireties.

Moreover, although not shown, the various components of the enclosure may consist of multiple layers that are glued, press fit, molded or otherwise secured together. In one example, the enclosure consists of multiple layers that form a single laminate structure formed for example by gluing. By way of example, the entire or portions of the enclosure walls may be formed from layers of metals, ceramics and/or plastics. In the case of radio transparency, the layers may include glass and ceramics as, for example, forming a wall with a glass outer layer and a ceramic inner layer (or vice versa).

Generally speaking, when using an internal antenna, it is desirable to increase the radio transparency of the enclosure in order to effectively perform wireless transmissions therethrough. Thus, a substantial portion of the enclosure is formed form materials capable of providing radio-transparency (e.g., glass, ceramics, plastics, etc.). In most cases, the radio transparent portions of the enclosure constitute a significant area of the entire enclosure, for example, greater than 50%, more particularly greater than 75%, and even more particularly greater than 85%. The radio transparent portions may even be greater than 90%, and more particularly greater than 95%, and in some cases 100% of the enclosure.

The radio transparent portions may be embodied in a variety of ways. In one embodiment, the radio transparent portions constitute the entire enclosure. For example, all the walls of the enclosure are radio transparent (e.g., both the main body and the end caps). In another embodiment, the radio transparent portions constitute one or more walls of the housing, such as, for example, the top and/or bottom member of the enclosure shown in FIG. 13. In another embodiment, the radio transparent portions may constitute a part of one or more walls of the enclosure. That is, only a portion of a wall may be radio transparent. For example, the wall may be separated into two parts, or in the case of a laminated wall, some portion of the wall may include a non radio transparent layer.

It is generally believed that a greater area of radio transparency produces a stronger signal during transmissions and stronger reception when a signal is received. However, other factors may play a role as for example the location of the internal antenna. By way of example, in an enclosure with a decreased amount of radio transparency, the internal antenna may be positioned closer or proximate to the radio transparent portions of the enclosure. Furthermore, it should be noted that although non radio transparent portions such as metals typically degrade radio transmissions, in some cases, non radio transparent portions may be designed in such a manner as to enhance or help radio transmissions.

While this invention has been described in terms of several preferred embodiments, there are alterations, permutations, and equivalents, which fall within the scope of this invention. For example, although some embodiments include an integrally formed internal rail system, in some cases the internal rail system may be a separate component that is attached within the main body or it may not even be included in some cases. It should also be noted that there are many alternative ways of implementing the methods and apparatuses of the present invention. For example, although an extrusion process is preferred method of manufacturing the integral tube, it should be noted that this is not a limitation and that other manufacturing methods may be used in some cases (e.g., injection molding, press forming). In addition, although the invention is directed primarily at portable electronic devices such as media players, and mobile phones, it should be appreciated that the technologies disclosed herein can also be applied to other electronic devices, such as remote controls, mice, keyboards, monitors, and accessories for such devices. It is therefore intended that the following appended claims be interpreted as including all such alterations, permutations, and equivalents as fall within the true spirit and scope of the present invention.

What is claimed is:

1. An electronic device comprising:
a touchscreen display; and
a glass enclosure surrounding the touchscreen display, the glass enclosure comprising:
an integral glass body section defining a front wall that is positioned over the touchscreen display and extends across the front wall of the glass enclosure, a rear wall that is opposite to the front wall, and a set of sidewalls that extends from the front wall to the rear wall, the integral glass body section defining an opening, the touchscreen display coupled to an inner surface of the front wall; and
a glass end cap covering the opening and attached to the integral glass body section.

2. The electronic device of claim 1, wherein:
the integral glass body section has a seamless profile that is defined by the front wall, the rear wall, and the set of sidewalls;
the glass end cap is a first glass end cap;
the opening is a first opening;
the integral glass body section defines a second opening; and
the glass enclosure further defines a second glass end cap covering the second opening and attached to the integral glass body section.

3. The electronic device of claim 2, wherein:
the first glass end cap is positioned within the first opening; and
the second glass end cap is positioned within the second opening.

4. The electronic device of claim 2, wherein the first and second glass end caps are laser frit bonded to the integral glass body section to define a hermetically sealed internal volume.

5. The electronic device of claim 1, wherein an ink layer is disposed over an internal surface of the set of sidewalls to define an opaque region along an edge of the touchscreen display.

6. The electronic device of claim 1, wherein:
the integral glass body section is formed using a blow molding process to define the front wall, the rear wall, and the set of sidewalls;
the integral glass body section further defines a bottom wall that is opposite to the opening; and
the glass end cap is bonded to the integral glass body section to define a substantially waterproof enclosure.

7. The electronic device of claim 6, wherein the glass end cap is laser frit bonded to the integral glass body section to define a seamless interface.

8. The electronic device of claim 6, wherein:
the integral glass body section defines a speaker port; and
a waterproof membrane covers the speaker port.

9. An electronic device comprising:
internal circuitry comprising a wireless transmitter and an internal antenna;
a battery;
a display operably coupled to the internal circuitry and the battery; and
an enclosure enclosing the internal circuitry, the battery, and the display, the enclosure defining;
an integral glass structure surrounding the display and defining a first opening and a second opening opposite to the first opening;
a first glass component bonded to the integral glass structure and covering the first opening; and
a second glass component bonded to the integral glass structure and covering the second opening, the display coupled to an inner surface of one or more of the integral glass structure or the first glass component.

10. The electronic device of claim 9, wherein:
the integral glass structure is a tubular glass structure that defines a front surface of the enclosure and a rear surface of the enclosure;
the internal antenna is configured to transmit wireless signals through at least a portion of the tubular glass structure; and
the display is coupled to an inner surface of the tubular glass structure.

11. The electronic device of claim 10, wherein:
the display is configured to produce a graphical output that is visible through the front surface of the enclosure; and
a capacitive touch sensor is positioned along the inner surface of the tubular glass structure and is configured to detect a touch input along an external surface of the tubular glass structure.

12. The electronic device of claim 9, wherein:
the integral glass structure is a tubular glass structure that defines a front surface of the enclosure;
the tubular glass structure includes an outer glass layer that surrounds an inner glass layer; and
the display is coupled to an inner surface of the tubular glass structure.

13. The electronic device of claim 12, wherein:
the outer glass layer is substantially transparent; and
the inner glass layer defines an opaque portion.

14. The electronic device of claim 9, wherein:
the integral glass structure is a glass band that defines a set of sidewalls of the enclosure;
the first glass component is positioned over the display and defines a front surface of the enclosure;
the second glass component defines a rear surface of the enclosure; and
the display is coupled to the inner surface of the first glass component.

15. The electronic device of claim 14, wherein:
the first glass component is laser frit bonded to a first side of the glass band; and
the second glass component is laser frit bonded to a second side of the glass band that is opposite to the first side of the glass band.

16. An electronic device comprising:
a glass enclosure comprising:
- an integral glass body section defining a front surface of the glass enclosure, and a rear surface of the glass enclosure opposite to the front surface;
- a first glass cap bonded to the integral glass body section and defining a top surface of the glass enclosure; and
- a second glass cap bonded to the integral glass body section and defining a bottom surface of the glass enclosure;

a display positioned below the front surface of the integral glass body section and configured to produce a graphical output along the front surface; and a touch sensor positioned below the front surface of the integral glass body section and configured to detect a touch input along the front surface, the touch sensor coupled to an inner surface of the integral glass body section.

17. The electronic device of claim 16, wherein:
the integral glass body section is formed from an extruded glass tube;
the first glass cap defines a rounded top edge of the glass enclosure; and
the second glass cap defines a rounded bottom edge of the glass enclosure.

18. The electronic device of claim 17, wherein:
a first polymer coating is disposed over the rounded top edge of the first glass cap; and
a second polymer coating is disposed over the rounded bottom edge of the second glass cap.

19. The electronic device of claim 16, wherein:
the first glass cap is frit bonded to a first surface of the integral glass body section; and
the second glass cap is frit bonded to a second surface of the integral glass body section.

20. The electronic device of claim 16, wherein:
the electronic device includes internal electronic components;
the integral glass body section defines a set of rails; and
the internal electronic components are attached to the set of rails of the integral glass body section.

* * * * *